US009224746B2

(12) United States Patent
Purayath et al.

(10) Patent No.: US 9,224,746 B2
(45) Date of Patent: Dec. 29, 2015

(54) INVERTED-T WORD LINE AND FORMATION FOR NON-VOLATILE STORAGE

(71) Applicant: SANDISK TECHNOLOGIES INC., Plano, TX (US)

(72) Inventors: Vinod R. Purayath, Santa Clara, CA (US); James Kai, Santa Clara, CA (US); Donovan Lee, Santa Clara, CA (US); Yuan Zhang, San Jose, CA (US); Akira Matsudaira, Milpitas, CA (US)

(73) Assignee: SanDisk Technologies Inc., Plano, TX (US)

( * ) Notice: Subject to any disclaimer, the term of this patent is extended or adjusted under 35 U.S.C. 154(b) by 0 days.

(21) Appl. No.: 14/072,222

(22) Filed: Nov. 5, 2013

(65) Prior Publication Data

US 2014/0346583 A1     Nov. 27, 2014

Related U.S. Application Data

(60) Provisional application No. 61/825,859, filed on May 21, 2013.

(51) Int. Cl.
*H01L 27/115* (2006.01)
*H01L 21/28* (2006.01)
*H01L 29/423* (2006.01)

(52) U.S. Cl.
CPC .... *H01L 27/11551* (2013.01); *H01L 21/28273* (2013.01); *H01L 27/11521* (2013.01); *H01L 27/11541* (2013.01); *H01L 29/42324* (2013.01)

(58) Field of Classification Search
None
See application file for complete search history.

(56) References Cited

U.S. PATENT DOCUMENTS

| 6,297,097 | B1* | 10/2001 | Jeong ............................. 438/264 |
| 7,026,684 | B2 | 4/2006 | Sakuma et al. |
| 7,105,406 | B2 | 9/2006 | Lutze et al. |
| 7,755,132 | B2 | 7/2010 | Mokhlesi |
| 7,879,643 | B2 | 2/2011 | Lung |
| 8,492,224 | B2 | 7/2013 | Purayath et al. |
| 2008/0144377 | A1* | 6/2008 | Watanabe et al. ......... 365/185.05 |
| 2009/0090962 | A1 | 4/2009 | Kikuchi |
| 2009/0294821 | A1* | 12/2009 | Yun et al. ...................... 257/314 |
| 2011/0309425 | A1 | 12/2011 | Purayath et al. |

(Continued)

FOREIGN PATENT DOCUMENTS

WO     2008088654 A1     7/2008

OTHER PUBLICATIONS

Invitation to Pay Additional Fees and Communication Relating to the Results of the Partial International Search dated Oct. 1, 2014, International Application No. PCT/US2014/038528.

(Continued)

*Primary Examiner* — Johannes P Mondt
(74) *Attorney, Agent, or Firm* — Vierra Magen Marcus LLP

(57) ABSTRACT

A non-volatile memory system, comprising non-volatile storage device with word lines having an inverted T-shape over floating gates. The inverted T-shape shape has a wider bottom portion and a thinner top portion. The thinner top portion increases the separation between adjacent word lines relative to the separation between the wider bottom portions. An air gap may separate adjacent word lines. The thinner top portion of the word lines increases the path length between adjacent word lines. The likelihood of word line to word line short may be decreased by reducing the electric field between adjacent word lines.

25 Claims, 31 Drawing Sheets

(56) References Cited

U.S. PATENT DOCUMENTS

| | | |
|---|---|---|
| 2011/0309426 A1* | 12/2011 | Purayath et al. .............. 257/316 |
| 2012/0161221 A1 | 6/2012 | Lee et al. |
| 2013/0105881 A1 | 5/2013 | Kai et al. |
| 2013/0161719 A1 | 6/2013 | Purayath et al. |

OTHER PUBLICATIONS

International Search Report & The Written Opinion of the International Searching Authority dated Nov. 17, 2014, International Application No. PCT/US2014/038528.

* cited by examiner

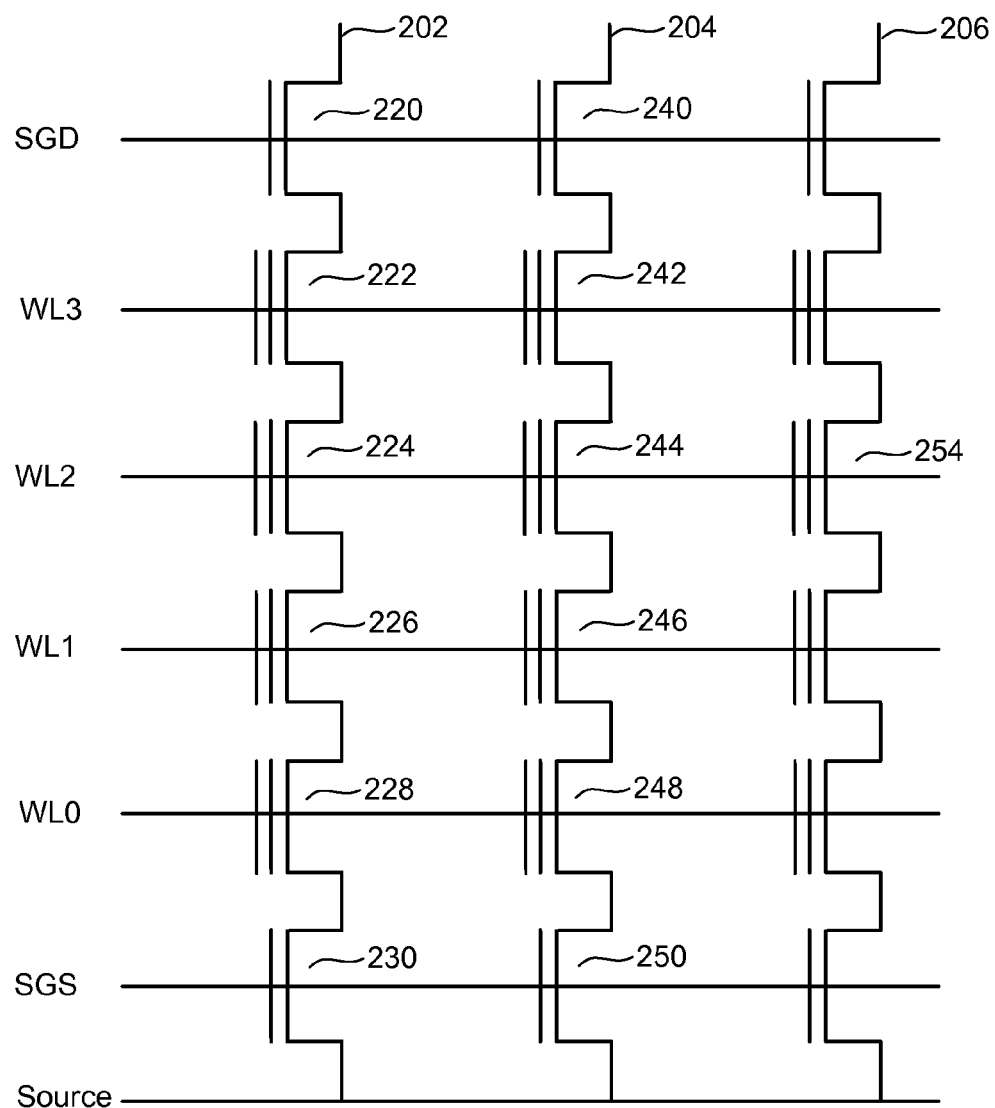

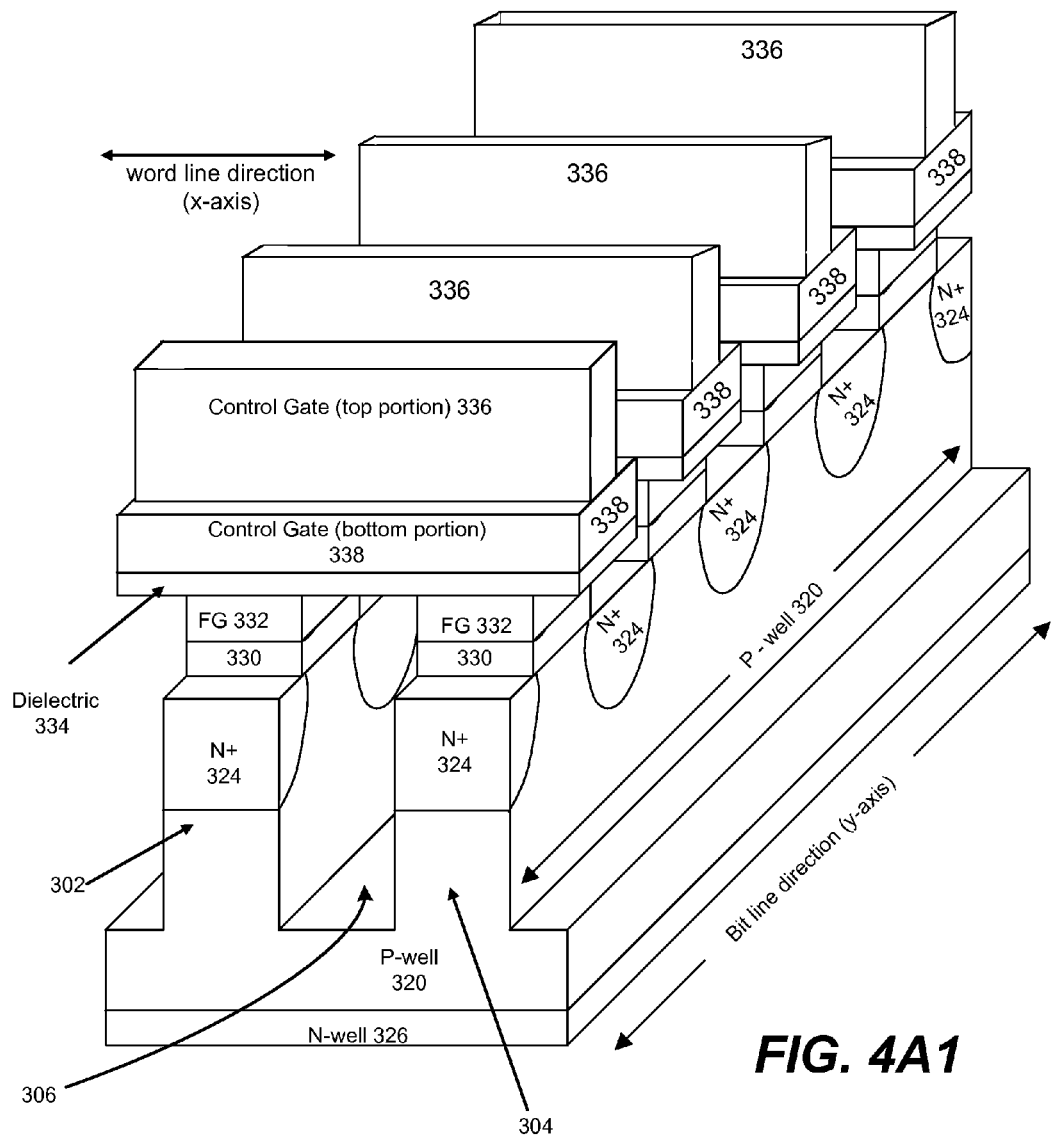
FIG. 4A1

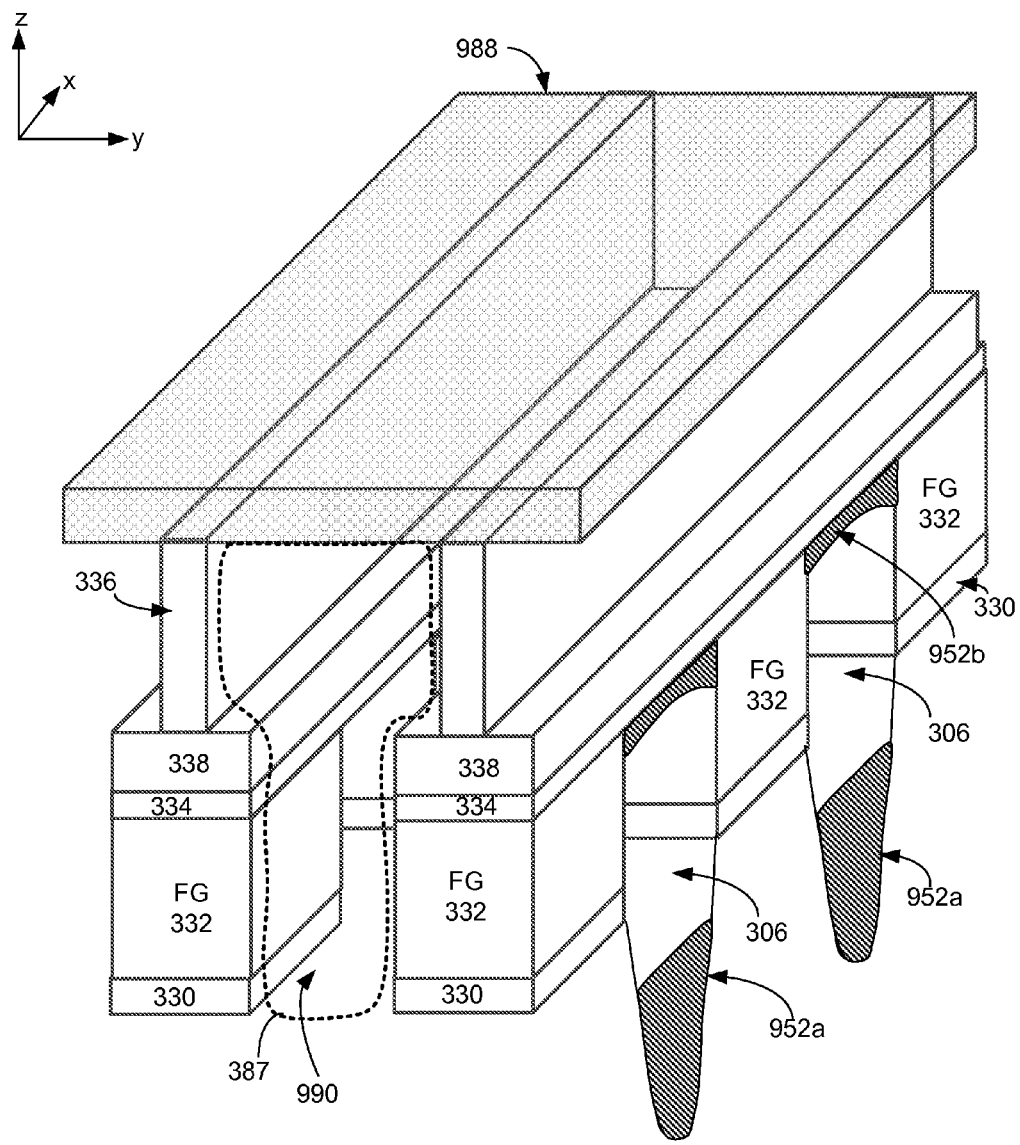
FIG. 4A2

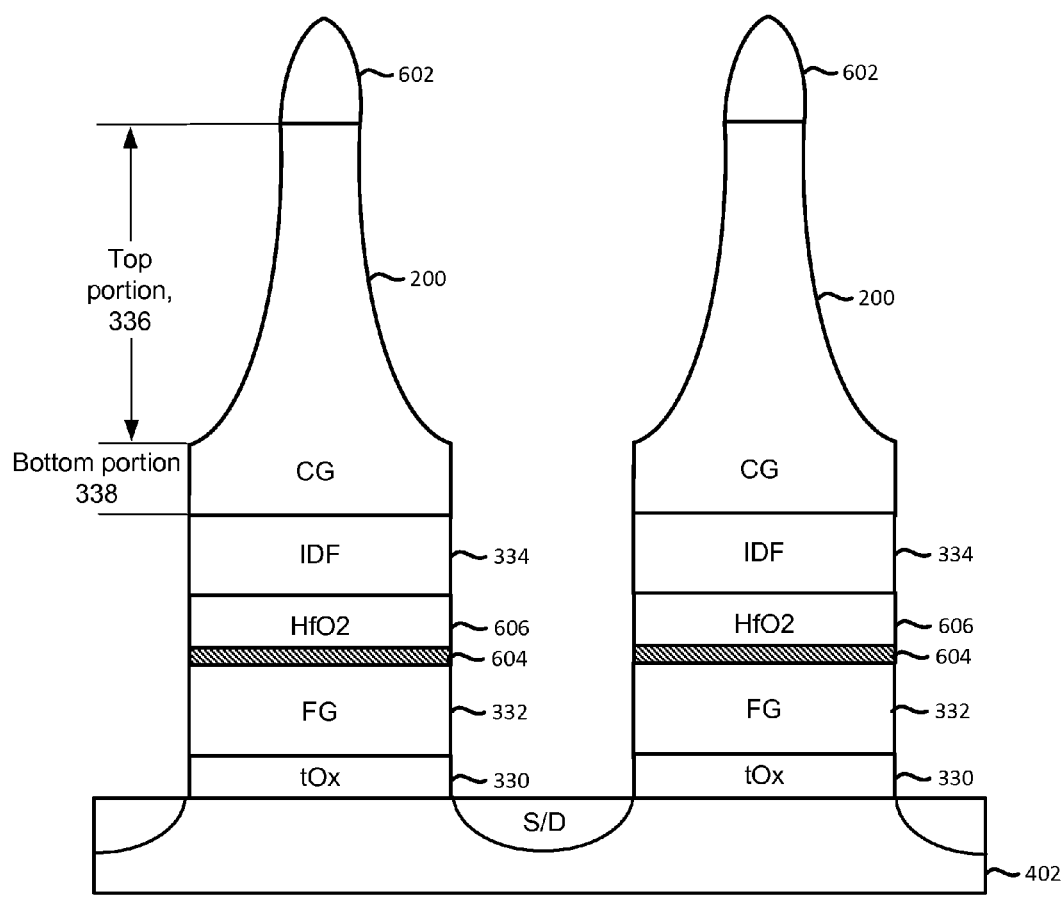
FIG. 6B    Bit line direction (y-axis)

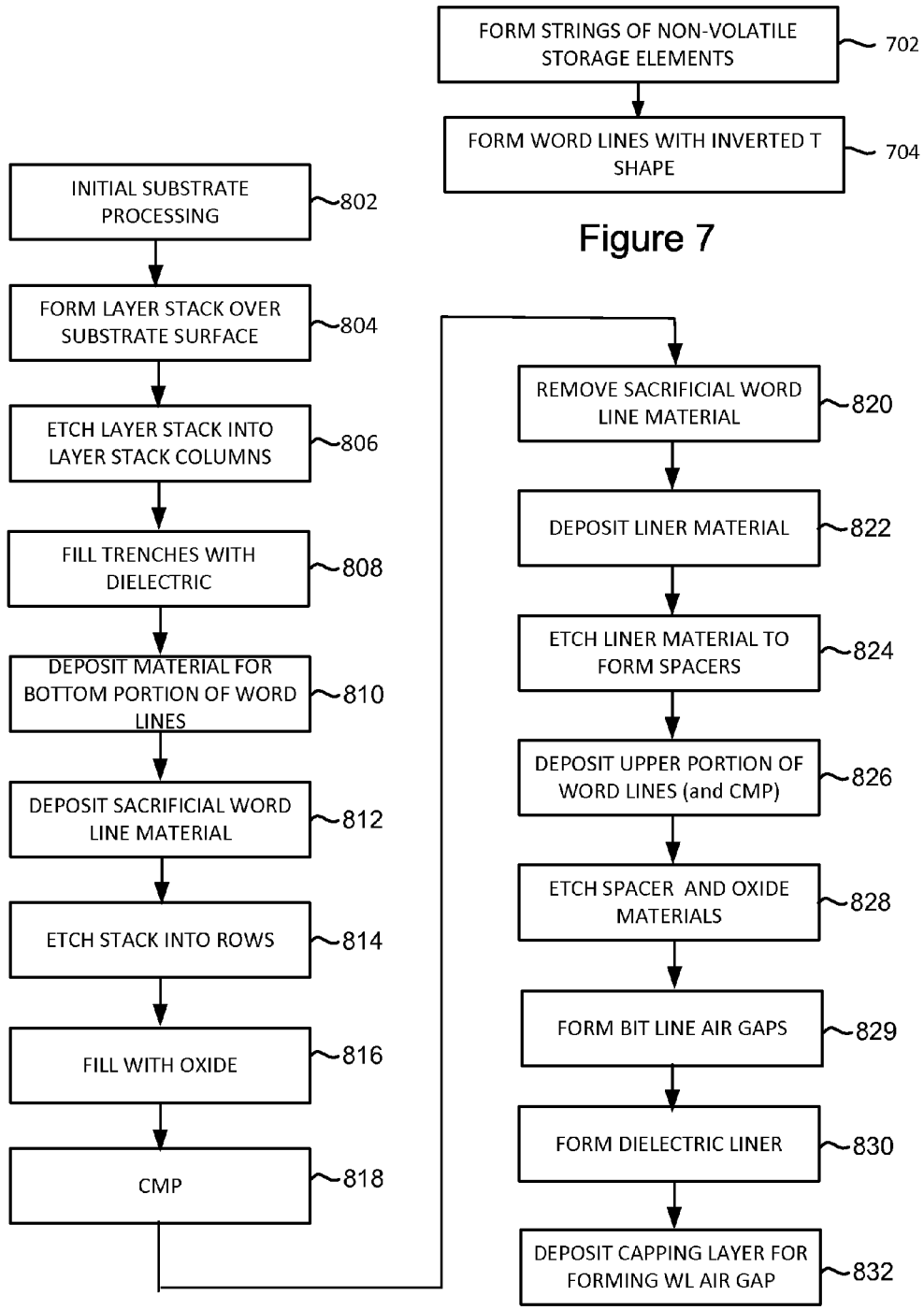

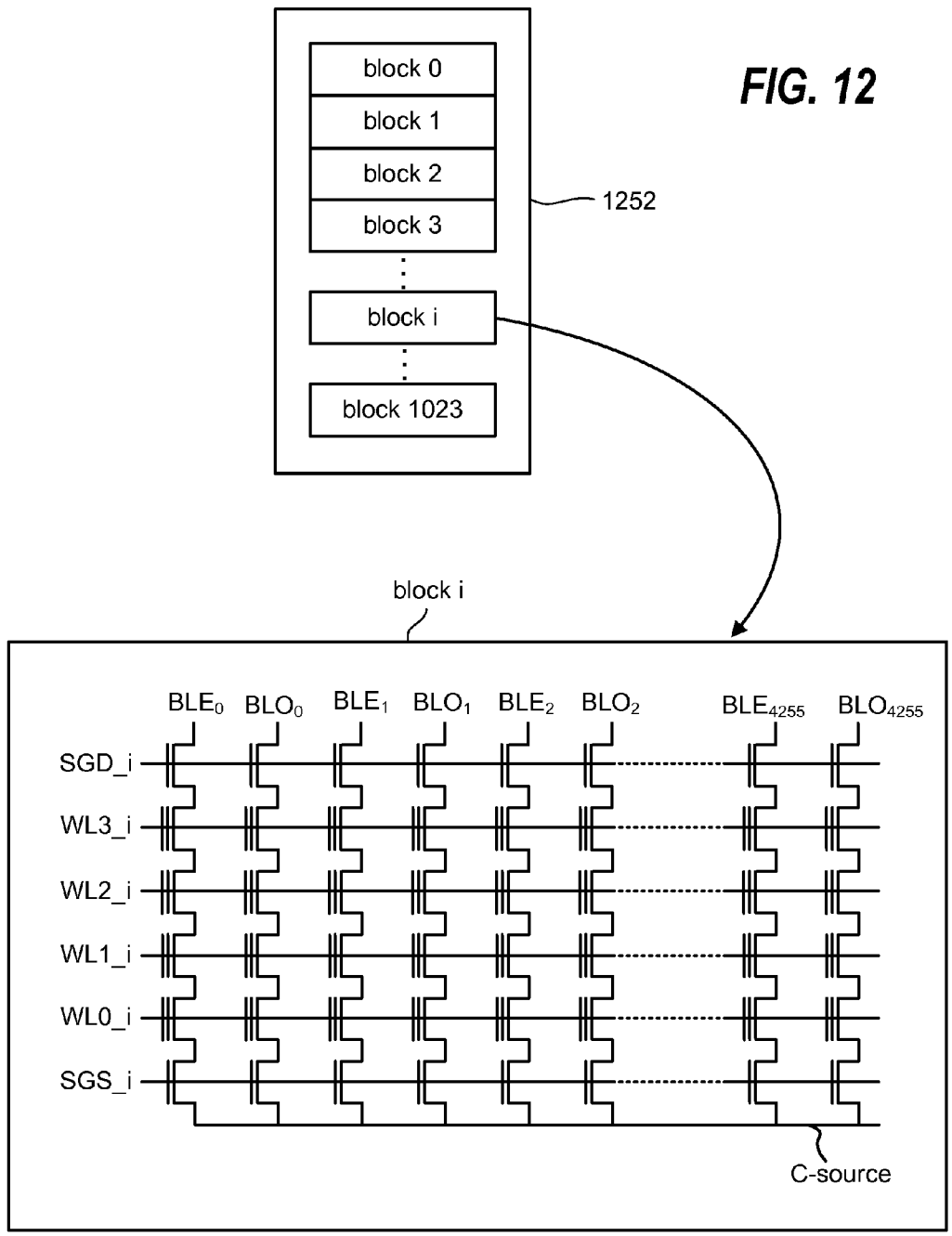

US 9,224,746 B2

INVERTED-T WORD LINE AND FORMATION FOR NON-VOLATILE STORAGE

PRIORITY

This application claims the benefit of U.S. Provisional Application No. 61/825,859, entitled "Inverse-T CG Structure and Formation for 2D NAND Cell," by Purayath et al., filed on May 21, 2013, incorporated herein by reference.

BACKGROUND

1. Field of the Disclosure

Embodiments of the present disclosure are directed to high density semiconductor devices, such as non-volatile storage, and methods of forming the same.

2. Description of the Related Art

In most integrated circuit applications, the substrate area allocated to implement the various integrated circuit functions continues to decrease. Semiconductor memory devices, for example, and their fabrication processes are continuously evolving to meet demands for increases in the amount of data that can be stored in a given area of the silicon substrate. These demands seek to increase the storage capacity of a given size of memory card or other type of package and/or decrease their size.

Electrical Erasable Programmable Read Only Memory (EEPROM), including flash EEPROM, and Electronically Programmable Read Only Memory (EPROM) are among the most popular non-volatile semiconductor memories. One popular flash EEPROM architecture utilizes a NAND array having a large number of strings of memory cells connected through one or more select transistors between individual bit lines and common source lines. FIG. 1A is a top view showing a single NAND string and FIG. 1B is an equivalent circuit thereof. The NAND string depicted in FIGS. 1A and 1B includes four transistors 100, 102, 104 and 106 in series between a first select gate 120 and a second select gate 122. Select gate 120 connects the NAND string to a bit line via bit line contact 126. Select gate 122 connects the NAND string to a common source line via source line contact 128. Each of the transistors 100, 102, 104 and 106 is an individual storage element and includes a control gate and a floating gate. For example, transistor 100 includes control gate 100CG and floating gate 100FG, transistor 102 includes control gate 102CG and floating gate 102FG, transistor 104 includes control gate 104CG and floating gate 104FG, and transistor 106 includes control gate 106CG and floating gate 106FG. Control gate 100CG is connected to word line WL3, control gate 102CG is connected to word line WL2, control gate 104CG is connected to word line WL1, and control gate 106CG is connected to word line WL0.

Note that although FIGS. 1A and 1B show four memory cells in the NAND string, the use of four transistors is only provided as an example. A NAND string can have less than four memory cells or more than four memory cells. For example, some NAND strings will include eight memory cells, 16 memory cells, 32 memory cells, or more.

The charge storage elements of current flash EEPROM arrays are most commonly electrically conductive floating gates, typically formed from a doped polysilicon material.

Another type of memory cell useful in flash EEPROM systems utilizes a non-conductive dielectric material in place of a conductive floating gate to form a charge storage element capable of storing charge in a non-volatile manner. Such a cell is described in an article by Chan et al., "A True Single-Transistor Oxide-Nitride-Oxide EEPROM Device," IEEE Electron Device Letters, Vol. EDL-8, No. 3, March 1987, pp. 93-95. A triple layer dielectric formed of silicon oxide, silicon nitride and silicon oxide ("ONO") is sandwiched between a conductive control gate and a surface of a semi-conductive substrate above the memory cell channel. The cell is programmed by injecting electrons from the cell channel into the nitride, where they are trapped and stored in a limited region. This stored charge then changes the threshold voltage of a portion of the channel of the cell in a manner that is detectable. The cell is erased by injecting hot holes into the nitride. See also Nozaki et al., "A 1-Mb EEPROM with MONOS Memory Cell for Semiconductor Disk Application," IEEE Journal of Solid-State Circuits, Vol. 26, No. 4, April 1991, pp. 497-501, which describes a similar cell in a split-gate configuration where a doped polysilicon gate extends over a portion of the memory cell channel to form a separate select transistor.

Memory cells of typical non-volatile flash arrays are divided into discrete blocks of cells that are erased together. That is, the block contains the minimum number of cells that are separately erasable together as an erase unit, although more than one block may be erased in a single erase operation. Additionally, more recent memories may provide erasing in smaller units than blocks. Each block typically stores one or more pages of data, where a page includes the minimum number of cells that are simultaneously subjected to a data programming and read operation as the basic unit of programming and reading, although more than one page may be programmed or read in a single operation. Each page typically stores one or more sectors of data, the size of the sector being defined by the host system. An example is a sector of 512 bytes of user data, following a standard established with magnetic disk drives, plus some number of bytes of overhead information about the user data and/or the block in which it is stored.

As demands for higher densities in integrated circuit applications have increased, fabrication processes have evolved to reduce the minimum feature sizes of circuit elements such as the gate and channel regions of transistors. As the feature sizes have decreased, modifications to the traditional NAND memory array have been made to, among other things, decrease parasitic capacitances associated with small feature sizes.

BRIEF DESCRIPTION OF THE DRAWINGS

FIG. 2A is a circuit diagram of three NAND strings with associated word lines.

FIG. 4A1 provides an additional perspective illustrating one embodiment of the inverted-T geometry of a word line (or control gate) according to embodiments.

FIG. 4A2 provides an additional perspective illustrating one embodiment of the inverted-T geometry of a word line (or control gate) according to embodiments.

FIG. 6B shows another view of memory cells have inverted-T geometry word lines (or control gates), in accordance with one embodiment.

FIG. 7 is a flow chart of one embodiment of a process for forming memory cells in accordance with embodiments.

FIG. 8 is a flowchart describing a method of fabricating a non-volatile storage device having word lines that have an inverted T-shape over floating gates in accordance with one embodiment.

FIG. 12 depicts an example of the organization of a memory array in accordance with one embodiment.

DETAILED DESCRIPTION

Figure 1A:
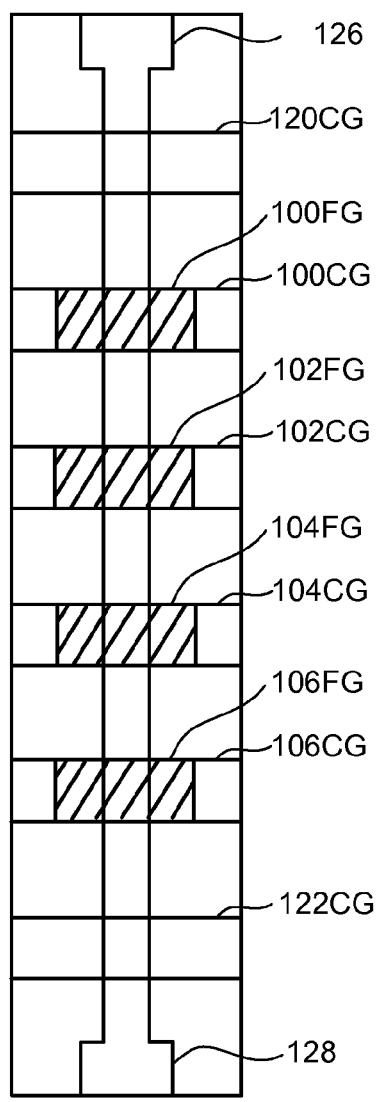
FIG. 1A is a top view of a NAND string.

The technology disclosed herein can be used with NAND flash memory with air gaps, NAND flash memory without air gaps and other types of non-volatile memory. Embodiments disclosed herein include a non-volatile storage device with word lines (or control gates) having an inverted T-shape above the floating gate. The inverted T-shape shape has a wider bottom portion above the floating gate and a thinner top portion. The thinner top portion increases the separation between adjacent word lines relative to the separation between the wider bottom portions. In one embodiment, an air gap separates adjacent word lines.

As the dimensions of memory continue to scale down, it is possible that there could be a word line to word line short during operation. This may be due to a relatively large difference in voltages on adjacent word lines, which can lead to a relatively large electric field. If the separation between word lines is smaller, this leads to a greater electric field. It is possible for the dielectric material between word lines to break down under a high electric field, thus resulting in a word line to word line short.

The thinner top portion of the word lines, in accordance with embodiments, increases the path length between adjacent word lines. The likelihood of word line to word line short may be decreased by reducing the electric field between adjacent word lines. Note that the electric field may be reduced because the effective distance between the top portions of adjacent word lines is increased as a result of the inverted-T geometry.

Prior to discussing further details of embodiments having word lines with an inverted-T shape, an example NAND architecture will be discussed.

A typical architecture for a flash memory system using a NAND structure will include many NAND strings. Each NAND string is connected to the source line by its source select gate controlled by select line SGS and connected to its associated bit line by its drain select gate controlled by select line SGD. Each bit line and the respective NAND string(s) that are connected to that bit line via a bit line contact comprise the columns of the array of memory cells. Bit lines are shared with multiple NAND strings. Typically, the bit line runs on top of the NAND strings in a direction perpendicular to the word lines and is connected to one or more sense amplifiers.

FIG. 2A shows three NAND strings 202, 204 and 206 of a memory array having many more NAND strings. Each of the NAND strings of FIG. 2A includes two select transistors and four memory cells. For example, NAND string 202 includes select transistors 220 and 230, and memory cells 222, 224, 226 and 228. NAND string 204 includes select transistors 240 and 250, and memory cells 242, 244, 246 and 248. Each NAND string is connected to the source line by its select transistor (e.g. select transistor 230 and select transistor 250). A selection line SGS is used to control the source side select gates. The various NAND strings are connected to respective bit lines by select transistors 220, 240, etc., which are controlled by select line SGD. In other embodiments, the select lines do not necessarily need to be in common. Word line WL3 is connected to the control gates for memory cell 222 and memory cell 242. Word line WL2 is connected to the control gates for memory cell 224, memory cell 244, and memory cell 252. Word line WL1 is connected to the control gates for memory cell 226 and memory cell 246. Word line WL0 is connected to the control gates for memory cell 228 and memory cell 248. As can be seen, each bit line and the respective NAND string comprises the columns of the array of memory cells. The word lines (WL3, WL2, WL1 and WL0) comprise the rows of the array.

Figure 2B:
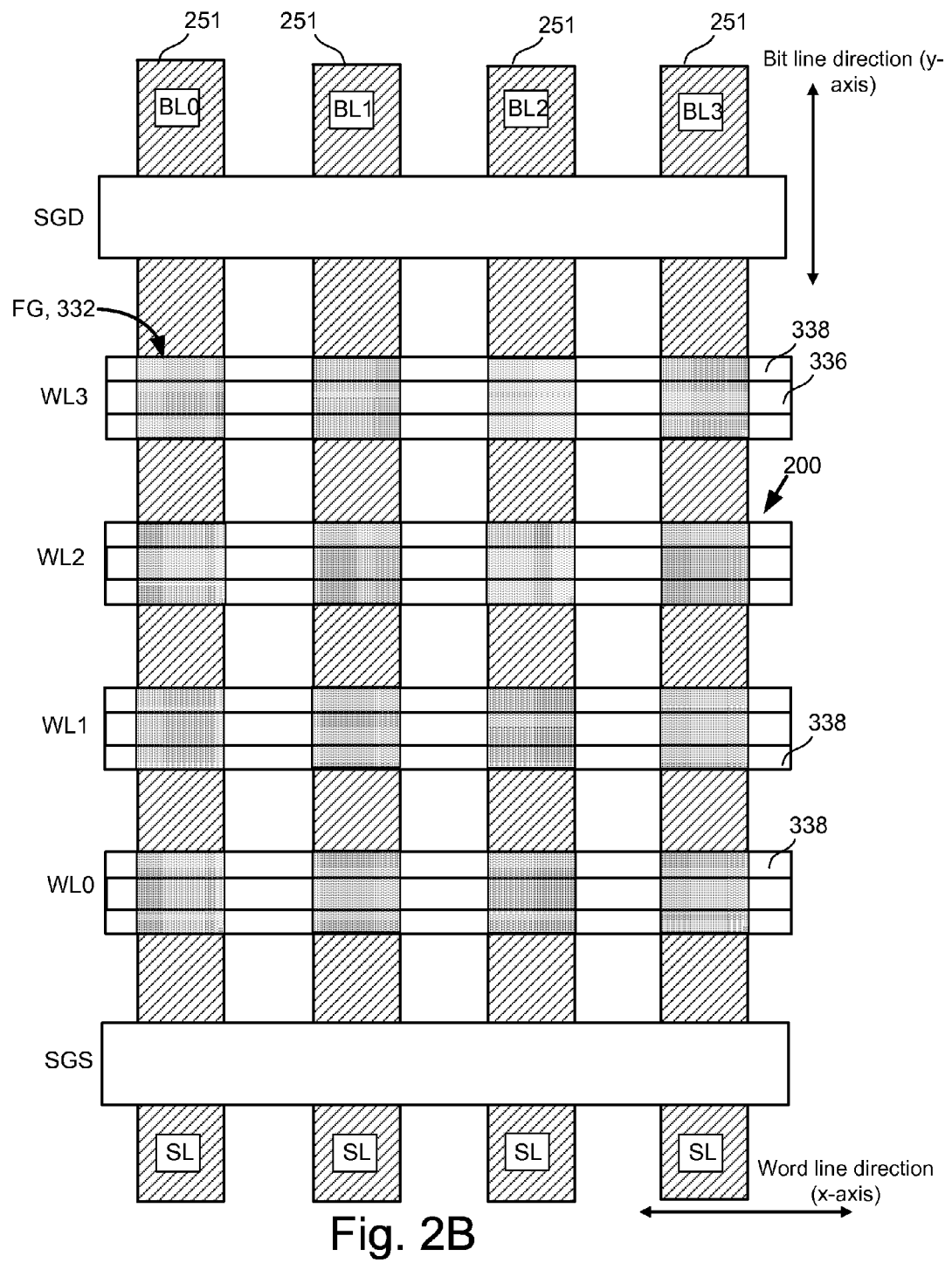
FIG. 2B is a top view of a portion of an array of 2D NAND flash memory cells.

FIG. 2B is a top view of a portion of an array of 2D NAND flash memory cells. The array includes NAND strings 251 and word lines 200. Control gate lines (also referred to as word lines) labeled WL0-WL3 extend across multiple NAND strings over rows of floating gates 332, often in polysilicon. Four floating gate memory cells are shown in each string 251 by way of example. BL0-BL3 represent bit line connections to global vertical bit lines (not shown). The line labeled SGD is a drain side select line. The line labeled SGS is a source side select line. SL represent source line connections to a common source line (not shown).

Note that FIG. 2B does not show all of the other details of the flash memory cells. Note that a NAND string can have fewer or more memory cells than depicted in FIGS. 2A and 2B. For example, some NAND strings will include eight memory cells, 16 memory cells, 32 memory cells, 64 memory cells, 128 memory cells, etc. The discussion herein is not limited to any particular number of memory cells in a NAND string. Furthermore, a word line can have more or fewer memory cells than depicted in FIGS. 2A and 2B. For example, a word line can include thousand or tens of thousands of memory cells. The discussion herein is not limited to any particular number of memory cells in a word line.

Each storage element can store data. For example, when storing one bit of digital data, the range of possible threshold voltages ($V_{TH}$) of the storage element is divided into two ranges which are assigned logical data "1" and "0." In one example of a NAND type flash memory, the $V_{TH}$ is negative after the storage element is erased, and defined as logic "1." The $V_{TH}$ after a program operation is positive and defined as logic "0." When the $V_{TH}$ is negative and a read is attempted, the storage element will turn on to indicate logic "1" is being stored. When the $V_{TH}$ is positive and a read operation is attempted, the storage element will not turn on, which indicates that logic "0" is stored. A storage element can also store multiple levels of information, for example, multiple bits of digital data. In this case, the range of $V_{TH}$ value is divided into the number of levels of data. For example, if four levels of information are stored, there will be four $V_{TH}$ ranges assigned to the data values "11", "10", "01", and "00." In one example of a NAND type memory, the $V_{TH}$ after an erase operation is negative and defined as "11". Positive $V_{TH}$ values are used for the states of "10", "01", and "00." The specific relationship between the data programmed into the storage element and the threshold voltage ranges of the storage element depends upon the data encoding scheme adopted for the storage elements.

When programming a flash storage element, a program voltage is applied to the control gate of the storage element, and the bit line associated with the storage element is grounded. Electrons from the channel are injected into the floating gate. When electrons accumulate in the floating gate, the floating gate becomes negatively charged and the $V_{TH}$ of the storage element is raised. To apply the program voltage to the control gate of the storage element being programmed, that program voltage is applied on the appropriate word line. As discussed above, one storage element in each of the NAND strings share the same word line. For example, when programming storage element 224 of FIG. 2A, the program voltage will also be applied to the control gates of storage elements 244 and 254.

Figure 2C:
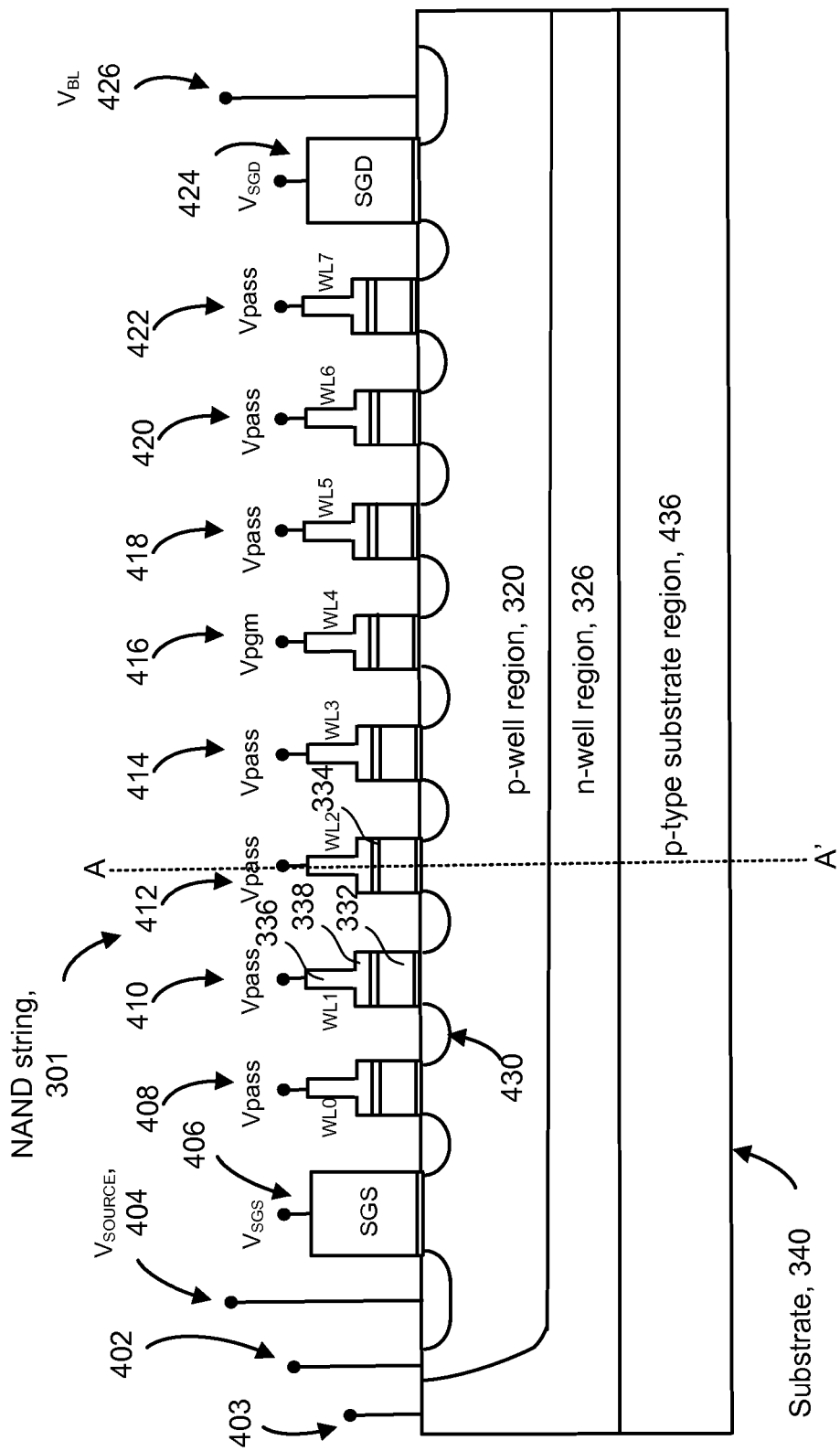
FIG. 2C depicts a cross-sectional view of a 2D NAND string formed on a substrate.

FIG. 2C depicts a cross-sectional view of a 2D NAND string formed on a substrate. The view is simplified and not to scale. The 2D NAND string 301 includes a source-side select gate 406, a drain-side select gate 424, and eight storage elements 408, 410, 412, 414, 416, 418, 420 and 422, formed on a substrate 340. A number of source/drain regions, one example of which is source/drain region 430, are provided on either side of each storage element and the select gates 406 and 424.

In one approach, the substrate 340 employs a triple-well technology which includes a p-well region 320 within an n-well region 326, which in turn is within a p-type substrate region 436. The 2D NAND string and its non-volatile storage elements can be formed, at least in part, on the p-well region. A source supply line 404 with a potential of VSOURCE is provided in addition to a bit line contact 426 with a potential of $V_{BL}$. Voltages, such as body bias voltages, can also be applied to the p-well region 320 via a terminal 402 and/or to the n-well region 326 via a terminal 403. During a program operation, a program voltage $V_{PGM}$ is provided on a selected word line, in this example, WL4, which is associated with storage element 416. Further, recall that the control gate of a storage element may be provided as a portion of the word line. For example, WL0, WL1, WL2, WL3, WL4, WL5, WL6 and WL7 can extend via the control gates of storage elements 408, 410, 412, 414, 416, 418, 420 and 422, respectively. A pass or boosting voltage, $V_{PASS}$ is applied to the remaining unselected word lines associated with NAND string 301. $V_{SGS}$ and $V_{SGD}$ are applied to the select gates 406 and 424, respectively.

An inter-gate dielectric 334 is depicted between the floating gate 332 and control gate 200. High dielectric constant (K) materials are used (e.g., for the intermediate dielectric material) in one embodiment. High K materials can enhance coupling between the control gates and floating gates. A self-aligned high-K approach is utilized in one embodiment to reduce or eliminate charge transfer through the intermediate dielectric material. Incorporation of thin metal/charge-trap type floating gates are used in one embodiment to reduce or eliminate concerns with ballistic charge programming issues that may exist with conventional polysilicon floating gates.

Embodiments of the present disclosure are directed to high-density semiconductor memory, and more particularly to electrical isolation between discrete devices in non-volatile memory. With shrinking feature sizes (as one example, on the order of ~15 nm channel lengths), the compositions and thicknesses commonly used for the gate insulation region contribute significantly to high programming voltages $V_{PGM}$ required to induce mechanisms such as Fowler-Nordheim tunneling to drive electrons onto the floating gates. During programming operations, while pulses are applied to a selected word line in a block for programming, the voltages on other word lines may be kept at a boosting voltage $V_{PASS}$, as depicted in FIG. 2C. The boosting voltage prevents or reduces program disturb.

Given the small distances between neighboring word lines in present technologies, the voltage difference between a selected word line at $V_{PGM}$ and a neighboring word line at $V_{PASS}$ may induce a strong electric field between these word lines. In some cases, this strong electric field causes a dielectric breakdown in the medium between these word lines, resulting in a word line to word line short.

Figure 2D:
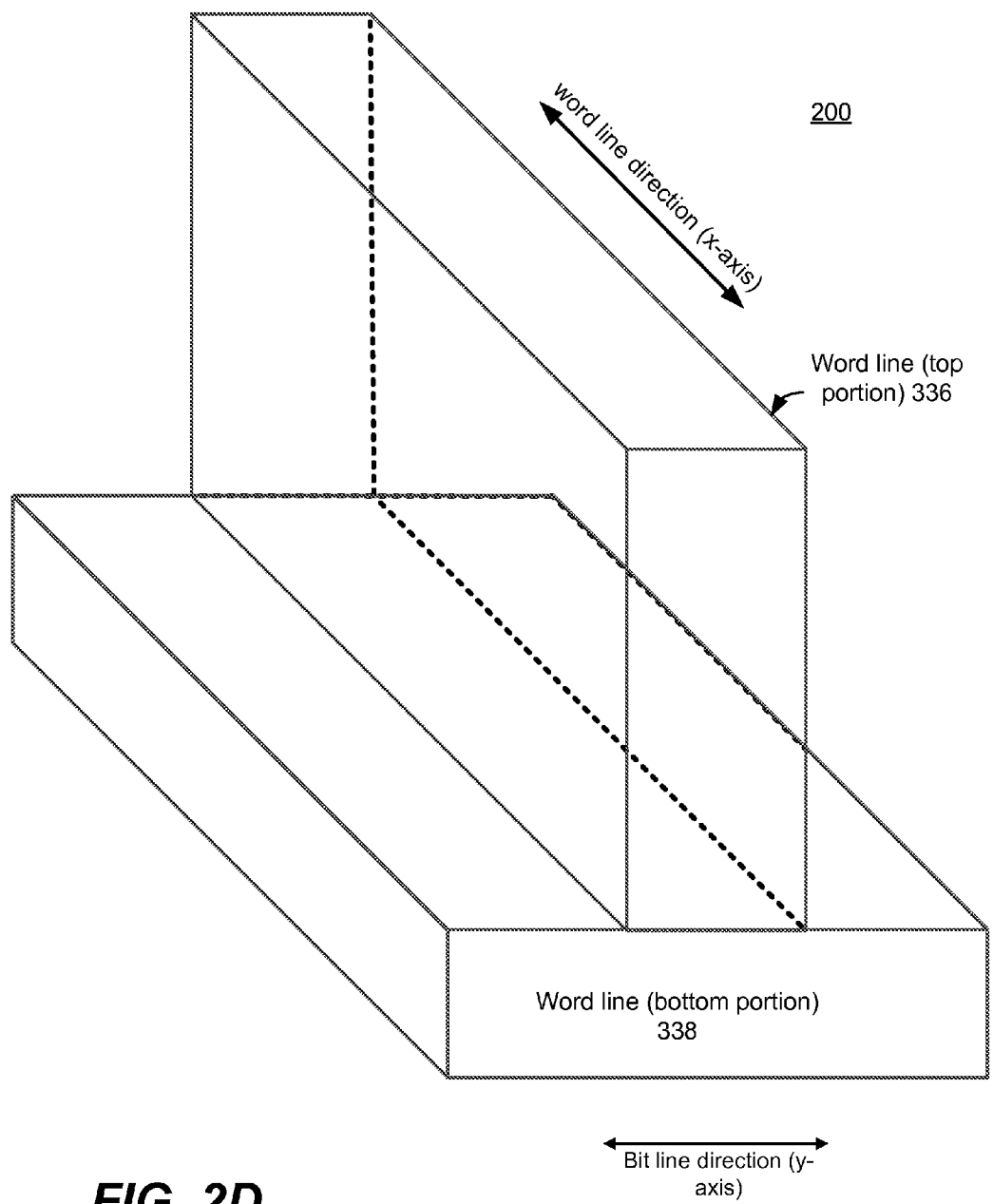
FIG. 2D is a diagram of one embodiment of a word line having an inverted T-shape.

Referring now to FIGS. 2B, 2C, and 2D, the word line has an inverted-T shape, at least over the floating gate, in accordance with embodiments. Referring now to FIG. 2D, the word line 200 has a bottom portion 338 and a top portion 336. Referring now to FIG. 2B, both the bottom portion 338 and the top portion 336 extend in the row or word line direction in one embodiment (along the x-axis). The top portion 336 is thinner than the bottom portion 338 in the column direction (along the y-axis or bit line direction). Referring again to FIG. 2D, the floating gates are not depicted in that diagram. However, there could be multiple floating gates under the word line 200, similar to the arraignment depicted in FIG. 2B.

Referring now to FIG. 2C, the thinner top portion 336 increases the separation between adjacent word lines relative to the separation between the bottom portions 338. Typically, there is some dielectric between the adjacent word lines, although this is not depicted in FIG. 2C. In one embodiment, the dielectric includes an air gap. In one embodiment, the dielectric includes a solid dielectric material. There might be a layer of solid dielectric material disposed on the sidewalls of the word lines, with an air gap therebetween.

In the example of FIGS. 2B and 2C, the bottom portions 338 have about the same width (in the y-direction) as the floating gates 332. Referring to the example of FIG. 2B, the bottom portions 338 completely cover the tops of the floating gates 332. This provides for good capacitive coupling between the bottom portion 338 of the word lines 200 and the top of the floating gates 332. Note that the word lines 200 may also be referred to as control gates.

The inverted-T shape of the control gate (or word line), according to embodiments, increases the distance between word lines relative to an architecture of similar scaling that does not have an inverted T-geometry. This increases the path length between adjacent word lines. The likelihood of word line to word line short may be decreased by reducing the electric field between adjacent word lines. Note that the electric field may be reduced because the effective distance between adjacent word lines is increased as a result of the inverted-T geometry.

In some embodiments, top portion 336 is formed from a first material and the bottom portion 338 is formed from a second material that is different from the first material. For example, the top portion 336 could tungsten. The bottom portion 338 could be heavily doped polysilicon, as one example.

In some embodiments, most of the height of the control gates of the memory cells is occupied by the relatively thin top portion 336 of the inverted-T shape. Because the top portion 336 of each memory cell is thin (compared to the bottom portion 338), the edges of the top portion 336 are relatively distant from those of neighboring word lines 200, resulting in reduced capacitive coupling between them.

Figure 3A:
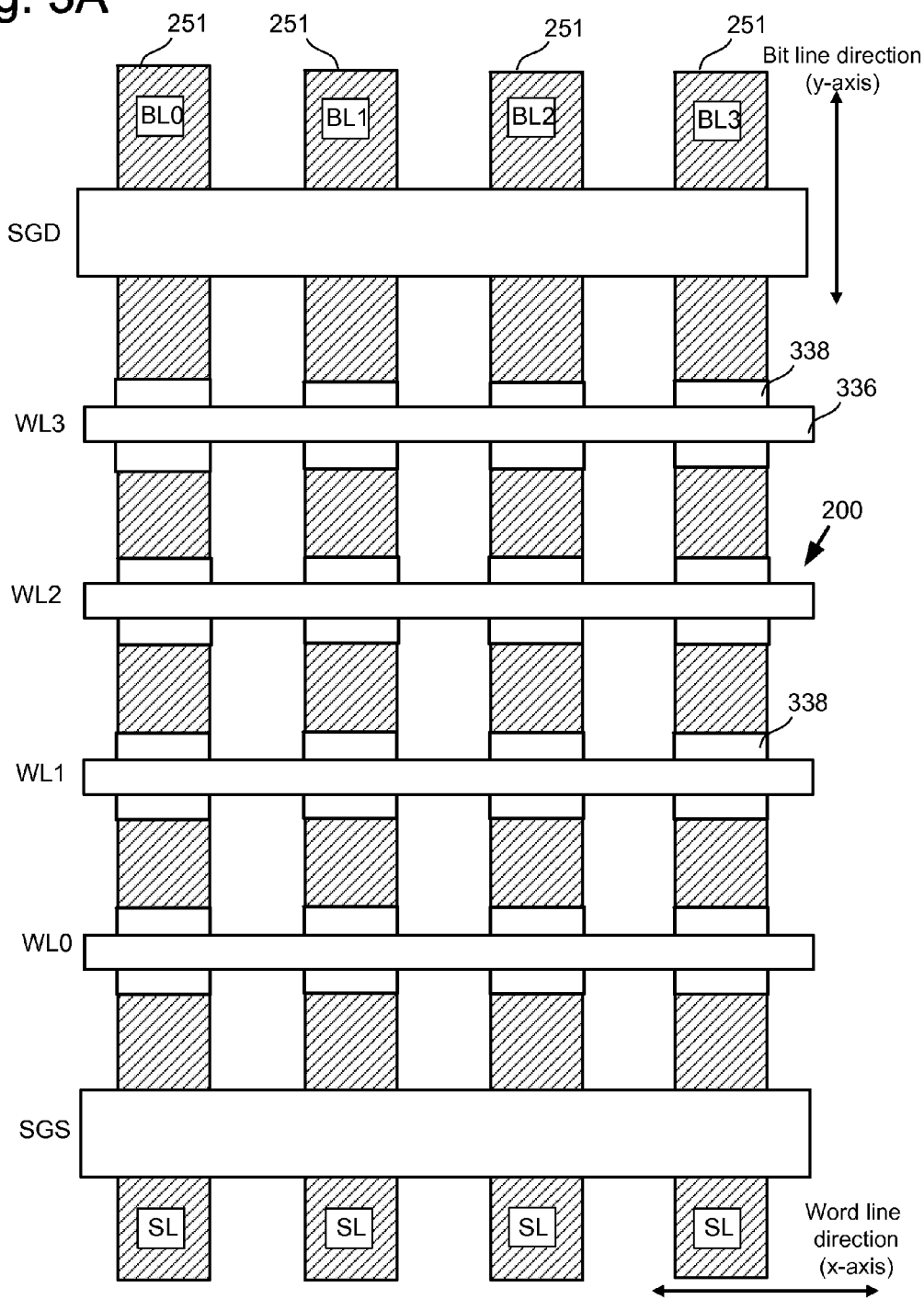
FIG. 3A is a top view of a portion of an array of 2D NAND flash memory cells.

Note that is it not required that the word line 200 have the inverted T-shape all the way along the row. FIG. 3A is a top view of a portion of an array of 2D NAND flash memory cells that is similar to the embodiment of FIG. 2B. However, in the embodiment of FIG. 3A, the word line 200 does not have the inverted T-shape all the way along the row.

Figure 3B:
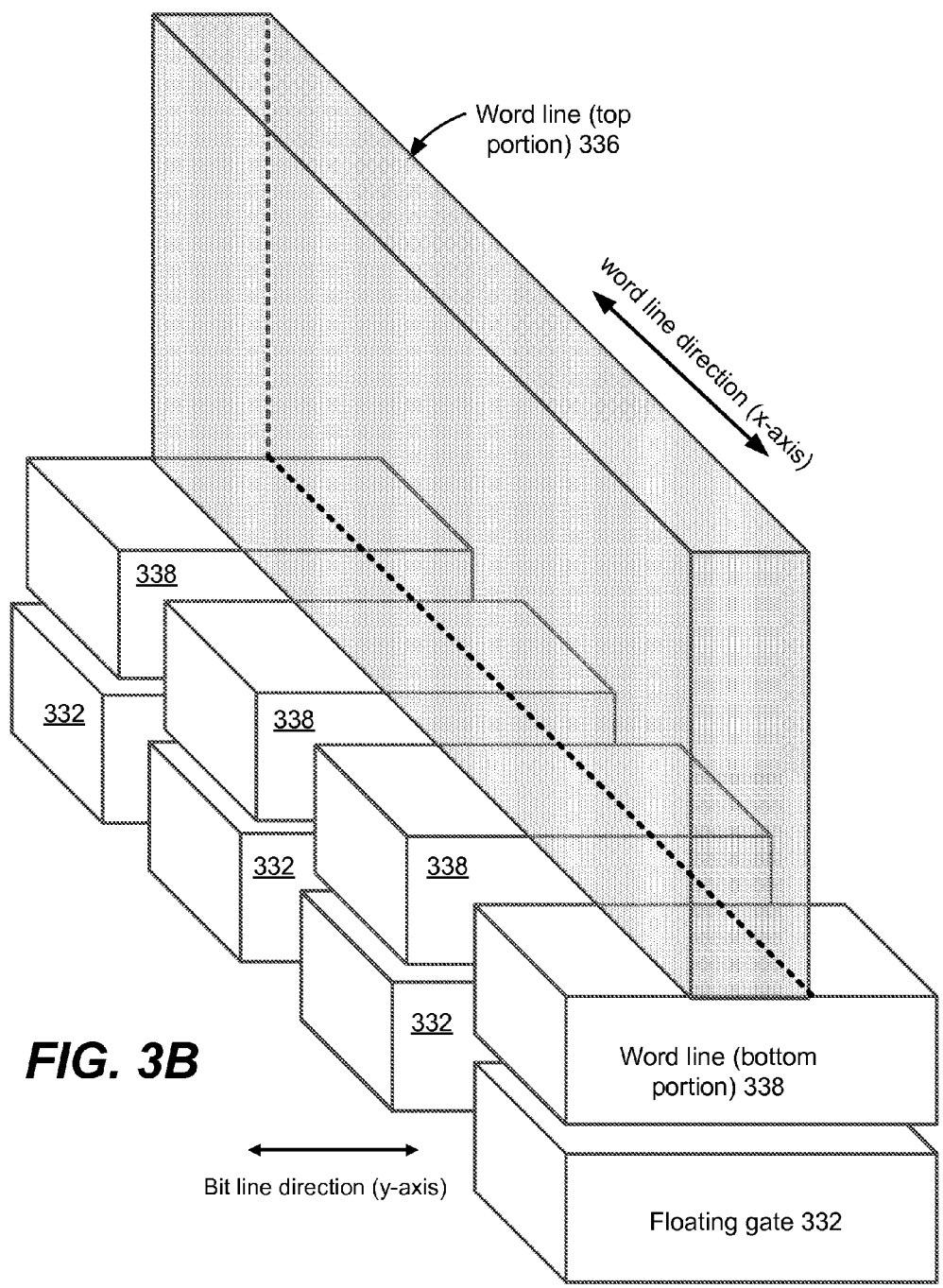
FIG. 3B shows a word line having a similar shape as the one depicted in FIG. 3A.

FIG. 3B shows one or the word lines 200 of FIG. 3A and associated floating gates 332. Referring to FIG. 3B, the word line 200 has an inverted T-shape over the floating gates 332. Note that the inter-gate dielectric 334 is not depicted in FIG. 3B. The floating gates 332 are below the bottom portion 338 of the word lines 200 in FIG. 3A, but are not depicted in FIG. 3A.

In the embodiment of FIG. 3B, the top portion 336 connects the bottom portions 338 that are over different floating gates 332. Note that the floating gates 332 in FIG. 3B are associated with memory cells of different NAND strings, in one embodiment having NAND strings.

In some embodiments, electrical isolation between word lines is enhanced, at least in part, by air gaps that are formed in the row (word line) direction. There may also be air gaps that are formed in the column (bit line) direction. In other embodiments, dielectric materials can be deposited in the regions that the air gaps would otherwise occupy.

Figure 1B:
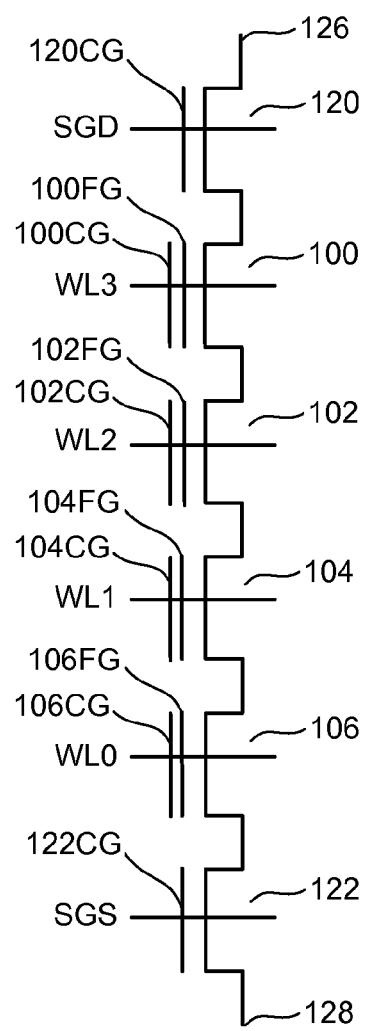
FIG. 1B is an equivalent circuit diagram of the NAND string depicted in FIG. 1.

FIG. 4A1 provides an additional perspective illustrating one embodiment of the inverted-T shape of a word line (or control gate) 200 according to embodiments. The control gate (or word line) has a bottom portion 338 that is flat running in the word line direction (x-direction). Together, the bottom portion 338 and top portion 336 form an inverted T-shape.

FIG. 4A1 shows the floating gates disposed on tunnel dielectric 330, which is disposed on the substrate. In this case, the substrate includes a p-well 320 and an n-well 326. Source/drain region 324 are depicted in the substrate in regions between floating gates 332. There is in inter-gate dielectric 334 between the bottom portion of the control gate 338 and the tops of the floating gates 332.

As will be discussed below, the region between floating gates on adjacent NAND strings 302, 304 is separated by a dielectric 306, such as an air gap. This may be referred to as a bit line air gap.

The air gaps formed in the row direction, referred to as word line air gaps, can provide electrical isolation between adjacent word lines. The word line air gaps may also electrical isolation between devices adjacent in the column direction. For example, adjacent rows of non-volatile storage elements such as the non-volatile storage elements associated with adjacent word lines in a NAND type non-volatile memory can be isolated using air gaps that are formed above the substrate between adjacent rows of storage elements.

In one embodiment, the bottom portions of the word line air gaps extend to the level of the substrate surface. In another embodiment, the bottom portions only extend to the level of the upper surface of the tunnel dielectric layer. The top portions of the word line air gaps may extend any desired distance above the substrate surface. In another example, the air gaps may extend vertically to the level of the lower surface of the intermediate dielectric layer. In another example, the air gaps may extend to a level of the lower surface of the control gate layer. In another example, the air gaps may extend to a level of the upper surface of the control gate layer or further.

In the column direction, the word line air gaps may extend the full distance between adjacent rows word lines or some portion thereof, for example where a liner, spacer or partial dielectric fill is used. The word line air gaps may separate more than the word lines. In this case, the word line air gaps may extend the full distance between adjacent rows storage elements or some portion thereof, for example where a liner, spacer or partial dielectric fill is used. In the row direction, the word line air gaps may extend the length of the word lines (and storage elements), such as may be formed for a block of NAND non-volatile storage elements. Each non-volatile storage element of a row may be coupled to a common word line. The air gaps may extend beyond an entire row or less than the entire length of a row.

The air gaps formed in the column direction, referred to as bit line air gaps, can provide electrical isolation between devices adjacent in the row direction. For example, adjacent columns of non-volatile storage elements, such as adjacent strings in a NAND type non-volatile memory, can be isolated using air gaps that are formed in the substrate between active areas underlying the adjacent columns. Although principally described with respect to NAND type non-volatile memory, it will be understood that the various air gaps described herein can be utilized in other arrays utilizing column and/or row arrangements for storage elements.

The dimensions of the bit line air gaps may vary according to the specifications for individual implementations. In one embodiment, the bit line air gaps are formed entirely below the substrate surface, extending vertically, with respect to the substrate surface, only within isolation regions formed within the substrate. In other embodiments, the bit line air gaps may extend above the surface of the substrate to at least partially occupy the area between adjacent columns of storage elements that are formed above adjacent active areas of the substrate. In one embodiment, the bit line air gaps may be formed exclusively above the substrate surface.

In the isolation regions, the bit line air gaps may extend to the bottom of the isolation region or less than all of the way to the bottom. Liners, partial fills and/or other material that may enter the isolation regions during the fabrication process may occupy part of the isolation region. Above the substrate surface, the bit line air gaps may extend any desired distance above the surface. For example, the air gap may extend to the level of the upper surface of the tunnel dielectric layer in one example. In another example, the air gaps may extend vertically to the level of the lower surface of the intermediate dielectric layer. In another example, the air gaps may extend to a level of the lower surface of the control gate layer.

In the row direction, the bit line air gaps may extend the full distance between the isolation region sidewalls or some portion thereof, for example where a liner or partial dielectric fill is used. Likewise, above the substrate surface, the air gaps may extend the full distance between adjacent columns of storage elements or some portion thereof, for example where a liner, spacer or partial dielectric fill is used.

In the column direction, the bit line air gaps may extend the length of a column of storage elements, such as may be formed for a block of NAND non-volatile storage elements. The air gaps may extend beyond an entire column or less than the entire length of a column.

FIG. 4A2 provides an additional perspective illustrating one embodiment of the inverted-T shape of a word line (or control gate) 200 according to embodiments. The control gate (or word line) has a bottom portion 338 that is flat running in the word line direction (x-direction). Together, the bottom portion 338 and top portion 336 form an inverted T-shape.

A word line air gap 990 is pointed out between the word lines 200. The word line air gap 990 extends in the z-direction from roughly the substrate to a capping layer 988 above the word lines. Although not depicted in FIG. 4A2, there may be a solid dielectric material in direct contact with the sidewalls of the word lines. Likewise, the solid dielectric material may be in direct contact with sidewalls of the floating gates 332 (as well as IPD 334 and tunnel dielectric 330). The solid dielectric material may extend over the surface of the substrate between the floating gates. The dashed line 387 roughly depicts where the portion of the surface of the solid dielectric material may be located in a y-z slice at the front face of the structure depicted in FIG. 4A2. Thus, the word line air gap 990 may reside inside of this of the solid dielectric material.

FIG. 4A2 also shows bit line air gaps 306 that extend in the bit line direction. The dielectric material 952a and 952b that is depicted represents an x-z slice at that side face of the structure depicted in FIG. 4A2. Dielectric material 952a and 952b extends in the bit line direction (extension in bit line direction not depicted in FIG. 4A2). Together, the bit line air gaps 306 and dielectric material 952 provide isolation between adjacent NAND strings. Dielectric 952a may be referred to as a show trench isolation (STI) structure.

Figure 4B:
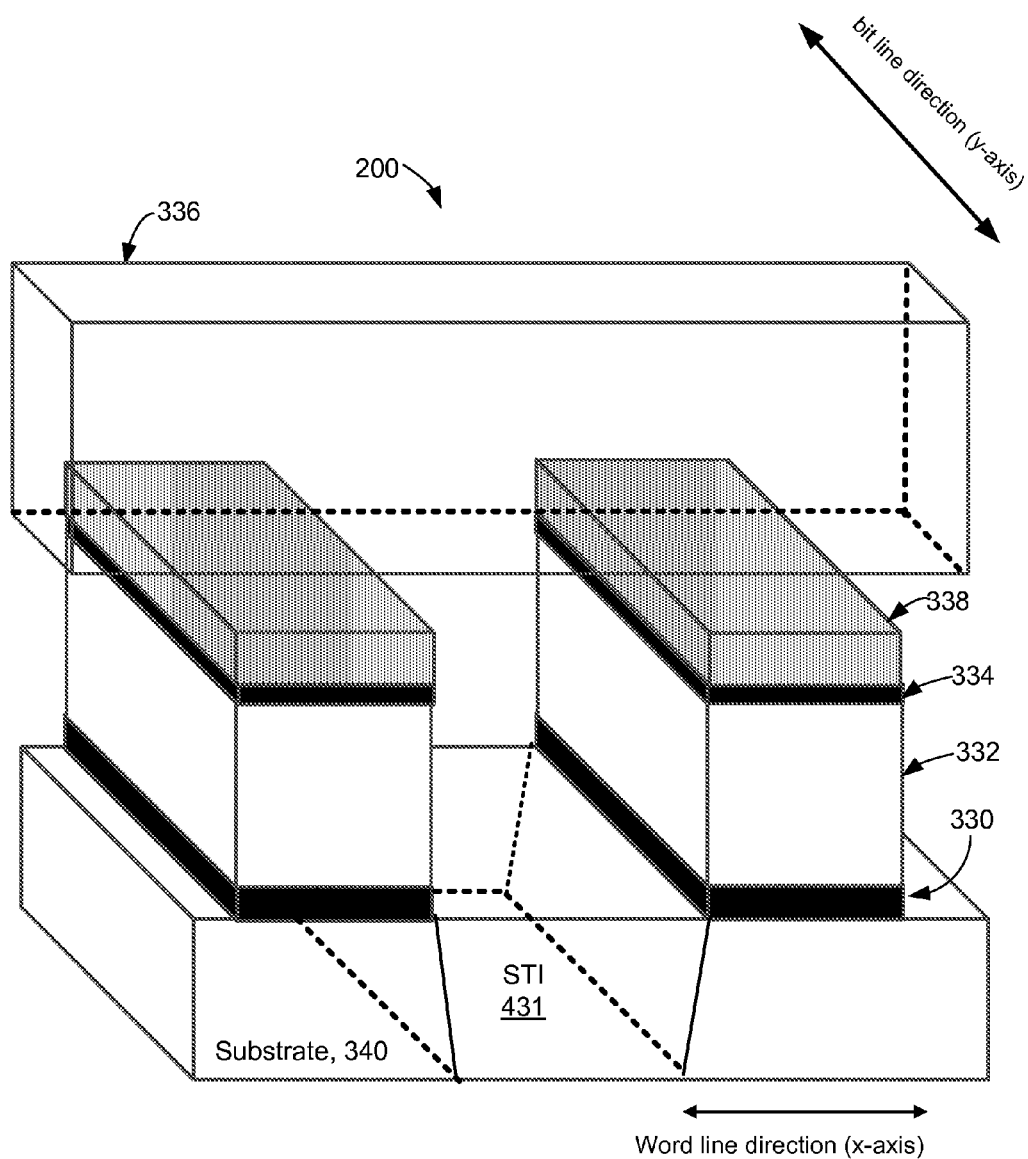
FIG. 4B depicts one embodiment of a word line and floating gates.

FIG. 4B depicts one embodiment of a word line that is somewhat similar to one embodiment depicted in FIGS. 4A1 and 4A2. In both Figures, the word line 200 has an inverted T-shape over the floating gate 332. Moreover, it is a cross section of the word line 200 taken in the y-direction that has the inverted T-shape. However, in FIG. 4B, the word line 200 does not maintain the inverted T-shape between floating gates.

FIG. 4B depicts two floating gates 332 that are associated with memory cells on adjacent NAND strings (NAND strings not depicted in FIG. 4B). Each floating gate 332 has an inter-gate dielectric 334 disposed on its top. The bottom portion 338 of the word line 200 is disposed on the inter-gate dielectric 334. The top portion 336 of the word line 200 electrically connects the bottom portions 338 of the word line 200. Thus, the word line 200 does not have an inverted T-shape between the floating gates 332 in this embodiment. However, it does have an inverted T-shape above the floating gates 332.

Figure 5A:
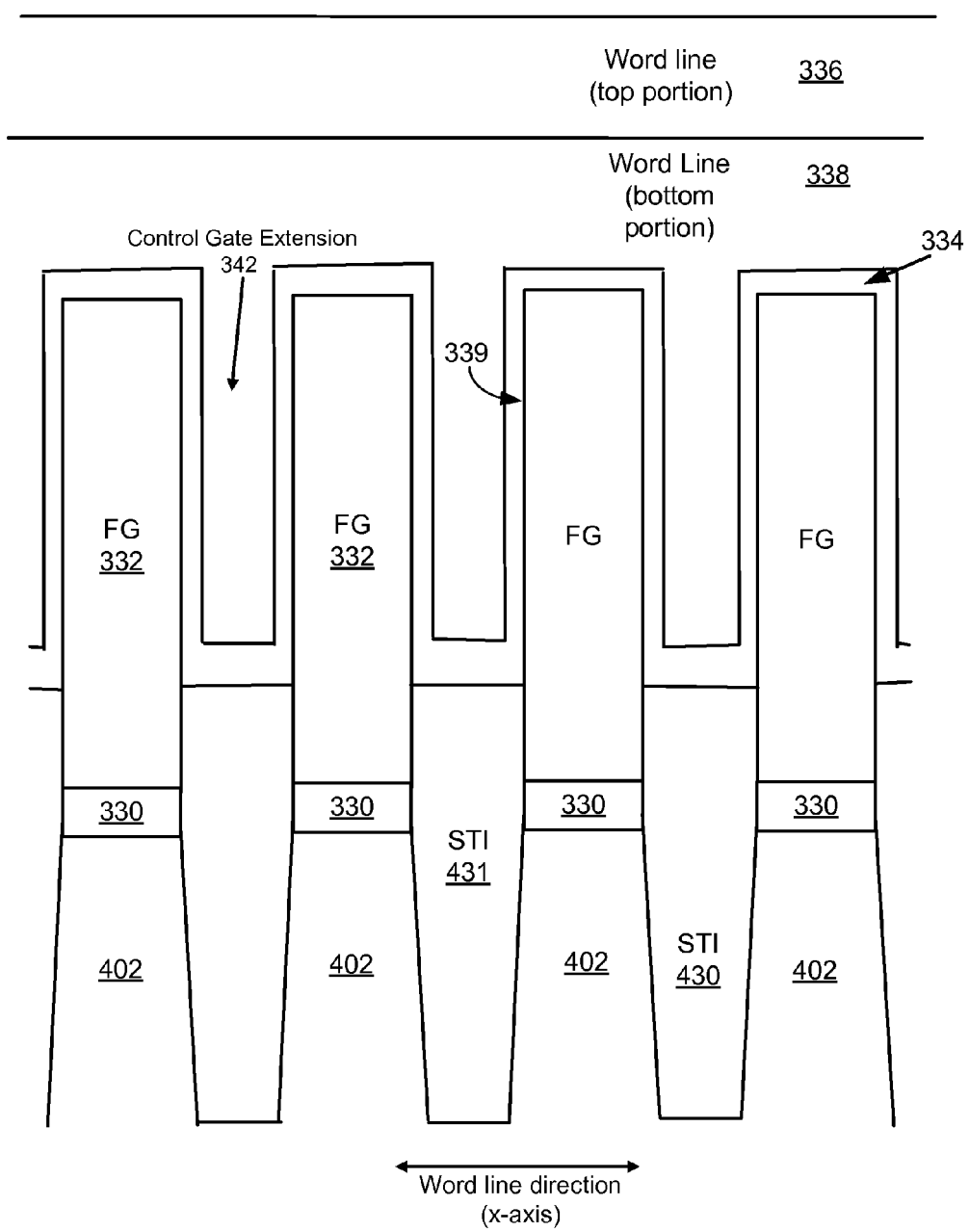
FIG. 5A shows a cross section along line A-A' from FIG. 2C.

FIG. 5A shows a cross section along line A-A' for one embodiment of a NAND string depicted in FIG. 2C. Thus, FIG. 5A depicts memory cells from adjacent NAND strings. In this example, four memory cells are depicted, but there could be more or fewer. The floating gate memory cell includes a floating gate (FG) 332, memory cell inter-gate dielectric (IPD) 334 (sometimes referred to as inter-poly dielectric), a bottom portion 338 of memory cell word line (or control gate) 338 and top portion 336 of memory cell word line (or control gate). Shallow trench isolation regions (STI) 431 are shown between adjacent NAND strings. The STI provide isolation between active areas of the NAND strings.

Note that the word line 200 is associated with the floating gates 332 of non-volatile storage elements on different NAND strings. In the embodiment of FIG. 5A, the control gate 200 has a control gate extension 342 that extends downward between floating gates 332 of adjacent NAND strings. Each floating gate 338 has pair of sidewalls 339 that has a face that is perpendicular to the row direction. The dielectric 334 covers the faces of the pair of sidewalls of a given floating gate 332. The control gate extension 342 extends downward between adjacent pairs of the floating gates 332 and covers the dielectric layer 334 adjacent to the pair of sidewalls 339 of a given floating gate.

Figure 5B:
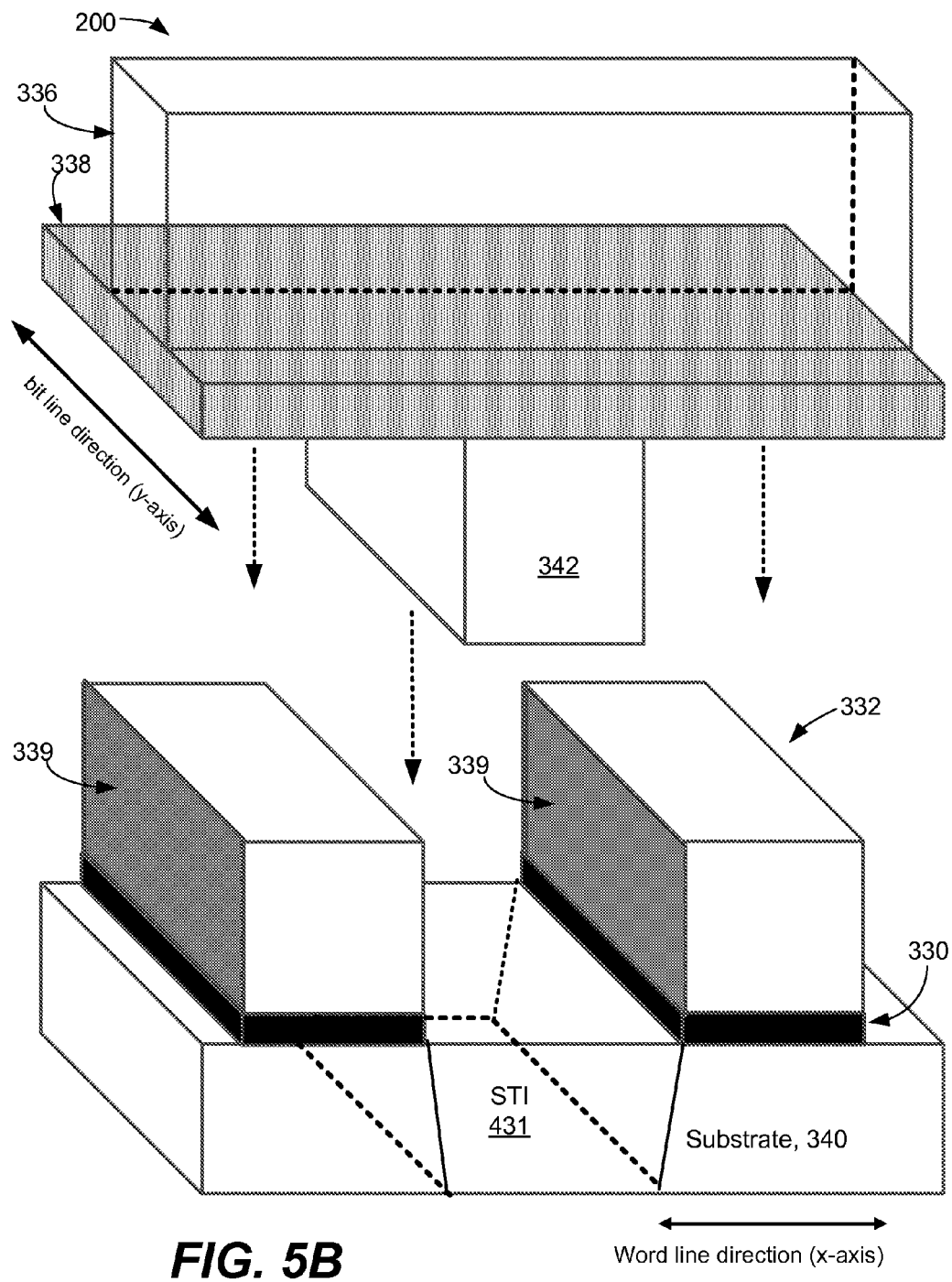
FIG. 5B shows an exploded view of a word line and floating gates to help further illustrate the foregoing, in accordance with one embodiment.

FIG. 5B shows an exploded view of a word line 200 and floating gates 332 to help further illustrate the foregoing, in accordance with one embodiment. The word line 200 depicted in FIG. 5B has a similar shape as the one depicted in FIG. 5A. FIG. 5B shows two floating gates 332 disposed on a gate dielectric 330, which in turn is disposed on the substrate 340. An STI 431 is depicted in the substrate 340 between the active areas (non-depicted in FIG. 5B) of the memory cells.

Each floating gate 332 has two sidewalls 339 that have a face that is perpendicular to the x-axis (the word line or row direction). One of the sidewalls of each floating gate is labeled with a reference numeral. The inter-gate dielectric is not depicted in FIG. 5B, so as to not obscure the diagram.

The word line 200 has a top portion 336 and a bottom portion 338. The word line 200 also has an extension 342 out of the bottom portion 338. The exploded view shows the word line 200 away from the floating gates 332 to allow the sidewalls 339 of the floating gates 332 to be seen. However, the extension 342 is located between the floating gates 332, similar to the view shown in FIG. 5A. The gate extension 342 is not a requirement, but can be used to provide additional capacitive coupling between the control gate 200 and floating gate 332.

Figure 6A:
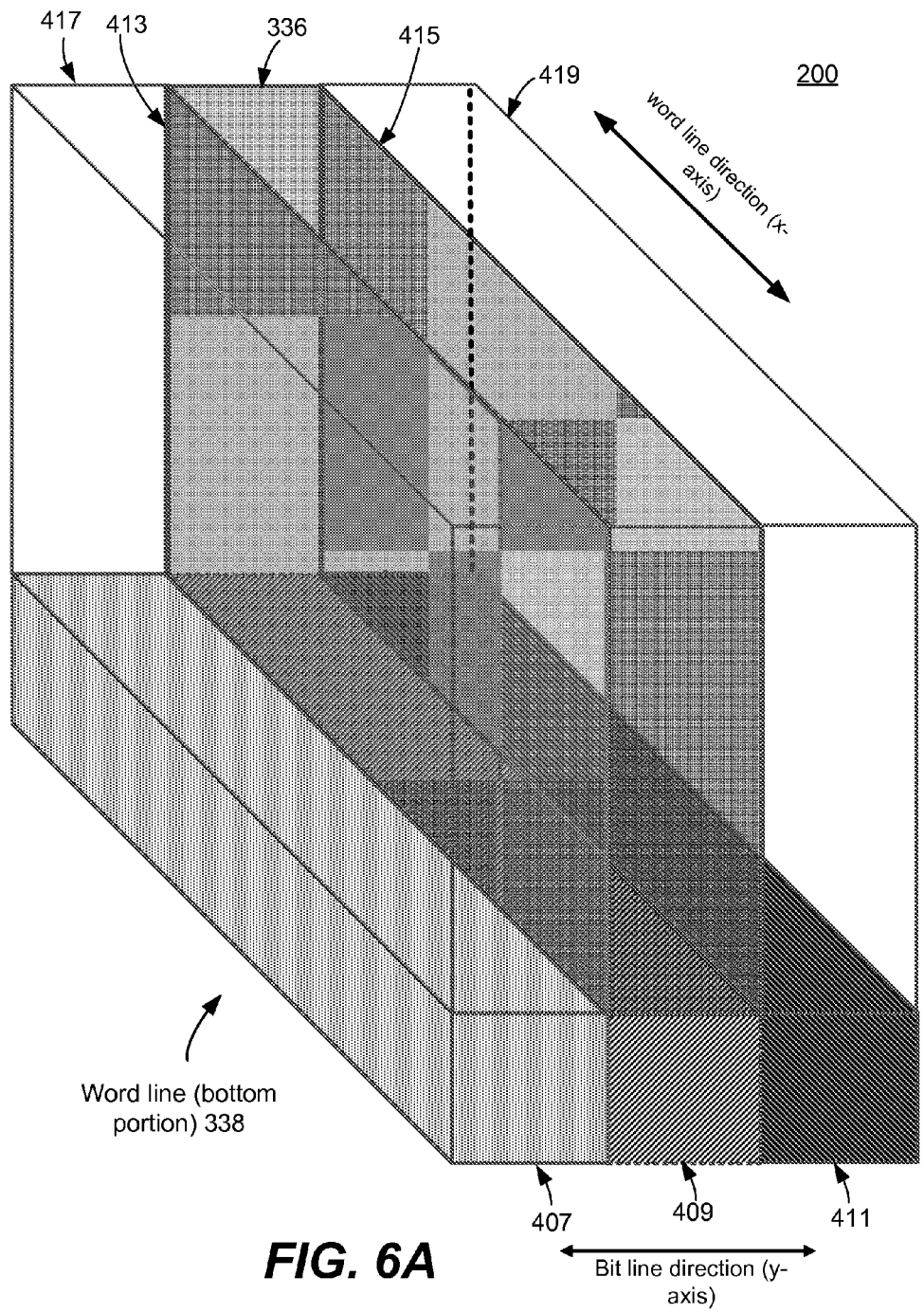
FIG. 6A shows additional details of a word line having an inverted T-shape with respect to one embodiment.

FIG. 6A shows additional details of a word line 200 having an inverted T-shape with respect to one embodiment. Again, it is a cross section taken in the y-axis (column direction) that has the inverted T-shape. Floating gates are not depicted in FIG. 6A. However, one or more floating gates 332 can be located under the word line 200, with a suitable dielectric therebetween, as shown and described in other embodiments herein.

For the sake of discussion, the bottom portion 338 is considered to have three regions. Reference to these three regions is to help further explain the shape of the word line. These three regions may be made from the same material. In one embodiment, the bottom portion 338 has a middle region 409 extending in the row (word line) direction between a first outer region 407 and second outer region 411 each extending in the row direction. In one embodiment, the top portion 336 is disposed on the middle region 409 of the bottom portion 338. The top portion 336 is thinner than the bottom portion 338 in the column (bit line) direction (or along the y-axis).

The top portion has a first sidewall 413 and a second sidewall 415 each extending in the row direction, in this embodiment. A face of the first sidewall 413 is perpendicular to the y-axis. Likewise, a face of the second sidewall 415 is perpendicular to the y-axis. FIG. 6A depicts a first dielectric region 417 over the first outer region 407 of the bottom portion 338 and located directly adjacent to the first sidewall 413 of the top portion 336. Likewise, there is a second dielectric region 419 over the second outer region 411 of the bottom portion 338 and located directly adjacent to the second sidewall 415 of the top portion 336. Thus, the top portion 336 is only over the middle region 409 and is not over the first outer region 407 or the second outer region 411.

The first dielectric 417 and second dielectric 419 could be an air gap in whole or in part. The first dielectric 417 and second dielectric 419 could be a solid material in whole or in part. For example, there could be a solid dielectric material directly in contact with the sidewalls 413, 415 of the top portion 336. However, this solid portion does not necessarily form all of the dielectric 417, 419 depicted in FIG. 6A. For example, farther away from the sidewalls 413, 415, the dielectric 417, 419 could be an air gap. As one example, there may be thin, more or less conformal layer of a solid dielectric material in direct contact with the sidewalls 413, 415 of the top portion 336 of the word line 200. Then, there could be an air gap next to the conformal layer of a solid dielectric material. However, an air gap is not required for the dielectric 417, 419.

FIG. 6B shows another view of memory cells have inverted T-shaped word lines 200 (or control gates), in accordance with one embodiment. FIG. 6B shows a view along the bit line direction (y-axis). Two memory cells are depicted. They could be associated two adjacent NAND strings. In this example, the top portion 336 of the control gate 200 is depicted as having some curvature. The demarcation between the top portion 336 and the bottom portion 338 is shown for purposes of illustration. The bottom portion 338 could be defined to include a bottom portion of the curved section of the word line 200.

In one embodiment, the material that forms the top portion 336 is different than the material that forms the bottom portion 338. In one embodiment, these two materials are etched at a different rate during formation of the memory cell, which helps to achieve a thinner top portion 336. However, note that in some embodiments the top portion 336 and bottom portion 338 are formed from the same material.

Since along most of the height of the top portion 336, the control gate is thinner than the bottom portion 338, the memory cell still benefits from the top portion 336 being further from adjacent top portions of word lines 200. FIG. 6 demonstrates that a control gate with an inverted T-shape can deviate to some degree in shape while still producing the same contemplated benefits.

In the embodiment depicted in FIG. 6B, there is a hard mask 602 over the top portion 336. The hard mask 602 is not required. In this embodiment, the memory cell includes a charge storage region 604 and an $HfO_2$ region 606. Note that memory cells in other embodiments may also include the charge storage region 604 and/or the $HfO_2$ region 606. Also, the example with the top portion 336 of the control gate 200 is depicted as having some curvature is not limited to memory cells having a charge storage region 604 and/or an $HfO_2$ region 606. Thus, the charge storage region 604 and/or the $HfO_2$ region 606 could be omitted.

FIG. 7 is a flow chart of one embodiment of a process for forming memory cells in accordance with embodiments. FIG. 7 can be used to form structures including, but not limited to, those depicted in FIGS. 2B, 2C, 2D, 3A, 3B, 4A1, 4A2, 4B, 5A, 5B, 6A, and 6B. The steps described herein are not necessarily to be treated as an ordered sequence. In step 702, strings (e.g., NAND strings) of non-volatile storage elements are formed. The strings have floating gates and dielectric disposed on the floating gates. The strings extend in a column direction.

In step 704, word lines having an inverted T-shape above floating gates 332 are formed. Each of the word lines extends in a row direction and is associated with a group of the non-volatile storage elements on different NAND strings. A cross section of the word lines 200 above the floating gates 332 in the column direction has an inverted T-shape. The word lines serve as control gates of the non-volatile storage elements.

With an inverted-T shape, a significant portion of each word line is separated by a greater difference from the neighboring word line than in the absence of the inverted-T geometry. For example, the top portions 336 of neighboring inverted T-shapes are separated by a greater distance than the bottom portions 338 of neighboring inverted T-shapes. For a given voltage difference between neighboring word lines 200, this separation means that the electric field between the neighboring word lines is lowered, making less likely a short between the word lines, even in the presence of contaminants between the word lines.

In some embodiments, hard mask layers disposed on the word lines are formed. These hard mask layers can assist with etching steps, as will be explained later. In some embodiments, the hard mask layers are later removed, but if they are not, they can serve to create a longer path for the electric field lines between neighboring control gates, thereby further reducing the electric field and improving the breakdown behavior of the memory system.

Figure 9A:
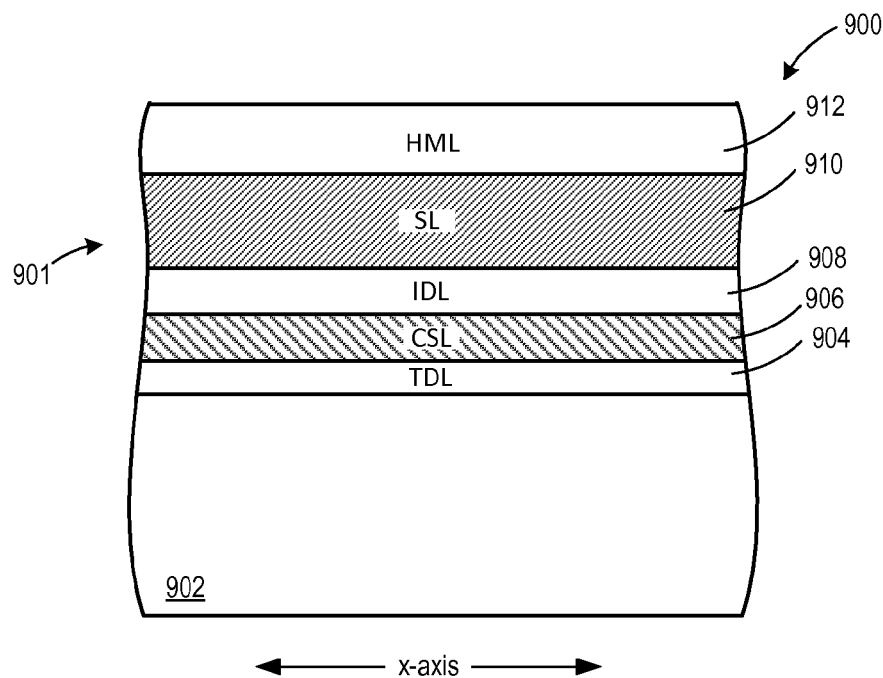
FIGS. 9A-9N are cross-sectional views of one example of a non-volatile memory array that can be fabricated according to the method in FIG. 8.

FIG. 8 is a flowchart describing a method of fabricating non-volatile storage with air gap isolation in accordance with one embodiment. FIGS. 9A-9N cross-sectional views of one example of a non-volatile memory array that can be fabricated according to the method in FIG. 8. FIG. 8 provides further details for one embodiment of FIG. 7. The described embodiment is exemplary only and its precise form should not be taken as limiting the disclosure. The exact materials, dimensions and order of processing may vary according to the requirements of a given implementation. It is noted that the dimensions of the various features are not necessarily drawn to scale.

At step 802, initial processing is performed to prepare a substrate for memory fabrication. One or more wells (e.g., a triple well) are typically formed in the substrate prior to forming a layer stack over the substrate surface. For example, a p-type substrate may be used. Within the p-type substrate, an n-type well may be created and within the n-type well a p-type well may be created. Various units of a memory array may be formed within individual p-type wells. The well(s) can be implanted and annealed to dope the substrate. A zero layer formation step may also precede well formation.

At step 804, an initial layer stack is formed over the substrate surface. FIG. 9A is a cross-sectional view along the x-axis in the row or word line direction of a memory array 900 showing a layer stack 901 formed over the surface of a substrate 902. In this example, layer stack 901 includes a tunnel dielectric layer (TDL) 904, a charge storage layer (CSL) 906, an intermediate dielectric layer (IDL) 908, a sacrificial layer (SL) 910 and one or more hard masking layer(s) (HML) 912. It is noted that a layer may be said to be over another layer when one or more layers are between the two layers as well as when the two layers are in direct contact.

The tunnel dielectric layer 904 is a thin layer of oxide (e.g., $SiO_2$) grown in one embodiment, although different materials and processes can be used. Chemical vapor deposition (CVD) processes, metal organic CVD processes, physical vapor deposition (PVD) processes, atomic layer deposition (ALD) processes, thermal oxidation or other suitable techniques can be used. In one example, the tunnel oxide layer is formed to a thickness of about 8 nanometers (nm). Although not shown, one or more high voltage gate dielectric regions may be formed at a peripheral circuitry region before or after forming the tunnel dielectric layer. The high voltage gate dielectric regions may be formed with a larger thickness (e.g., 30-40 nm) than the tunnel dielectric layer.

The charge storage layer is a polysilicon floating gate layer in one embodiment. The vertical dimension (with respect to the substrate surface) or thickness of the charge storage layer can vary by embodiment. In one embodiment, the charge storage layer has a vertical dimension of 10 nm. In another embodiment, the charge storage layer has a vertical dimension of 70-80 nm. The charge storage layer could have other vertical dimensions.

Dielectric charge storage materials, metal and non-metal nanostructures (e.g., carbon) can also be used for the layer of charge storage material. In one embodiment, the charge storage layer is a metal layer forming a charge-trap type floating gate layer. A thin metal charge-trap type floating gate can reduce concerns with ballistic charge programming issues that may arise with conventional polysilicon floating gates. In one embodiment, a metal floating gate layer is formed to a thickness of between 5 nm and 10 nm. In another embodiment, metal thicknesses less than 5 nm are used. Thicknesses greater than 10 nm might also be used. In one embodiment, the layer of charge storage material comprises nano-particles. Further details of forming charge storage regions comprising nano-particles are described in U.S. Pat. No. 8,383,479, titled "Integrated Nanostructure-Based Non-Volatile Memory Fabrication," to Purayath et al., which is hereby incorporated by reference. In one embodiment, the metal floating gate layer is a high work function metal. In one example, the metal is ruthenium. Other metals such as palladium, platinum, rhodium, titanium, tungsten, tantalum, nickel, cobalt, etc., and their alloys (e.g., TiN, WN, TaN, NiSi, CoSi, WSix) can be used.

The intermediate dielectric layer 908 is a triple layer of oxide, nitride and oxide (ONO) in one embodiment. In one embodiment, a high-K (dielectric constant) material is used for the intermediate dielectric to reduce or eliminate charge transfer through the intermediate layer while providing enhanced control gate to floating gate coupling. The sacrificial layer 910 is a layer of nitride in one embodiment although other materials can be used. The hard masking layer(s) 912 is an oxide or combination of oxide and nitride in one embodiment although other materials can be used.

The layer stack is patterned and etched at step 806, in accordance with a first pattern. The first pattern applied at step 806 corresponds to intended columns of the memory array and may be repetitive in the row or direction of the x-axis. The pattern also corresponds to intended active areas of the substrate which will be separated by isolation regions. In one embodiment, conventional photolithography using photoresist is used to pattern the hard mask layer 912 into strips elongated in the direction of the y-axis with spaces between strips adjacent in the direction of the x-axis. The hard mask layer may be patterned into a first sub-pattern at the memory array area and one or more different sub-patterns at the peripheral circuitry areas to define active areas in the substrate with different dimensions in the direction of the x-axis. Spacer-assisted patterning, nano-imprint patterning, and other patterning techniques can also be used to form strips of the hard mask layer at reduced feature sizes. The pattern may define a first direction of etching to form columns of the targeted memory array.

After forming the pattern, the layer stack is etched. The substrate may be etched as well. The layer stack and substrate are both etched using the first pattern formed in step 806. The layer stack is etched into layer stack columns. The substrate is etched into active areas which underlie the columns and isolation regions which separate the active areas. The term layer stack is used to refer to the layers formed over the substrate throughout processing. Thus, layer stack 901 may refer to the collection of layer stack columns that result from etching the initial layer stack.

Figure 9B:
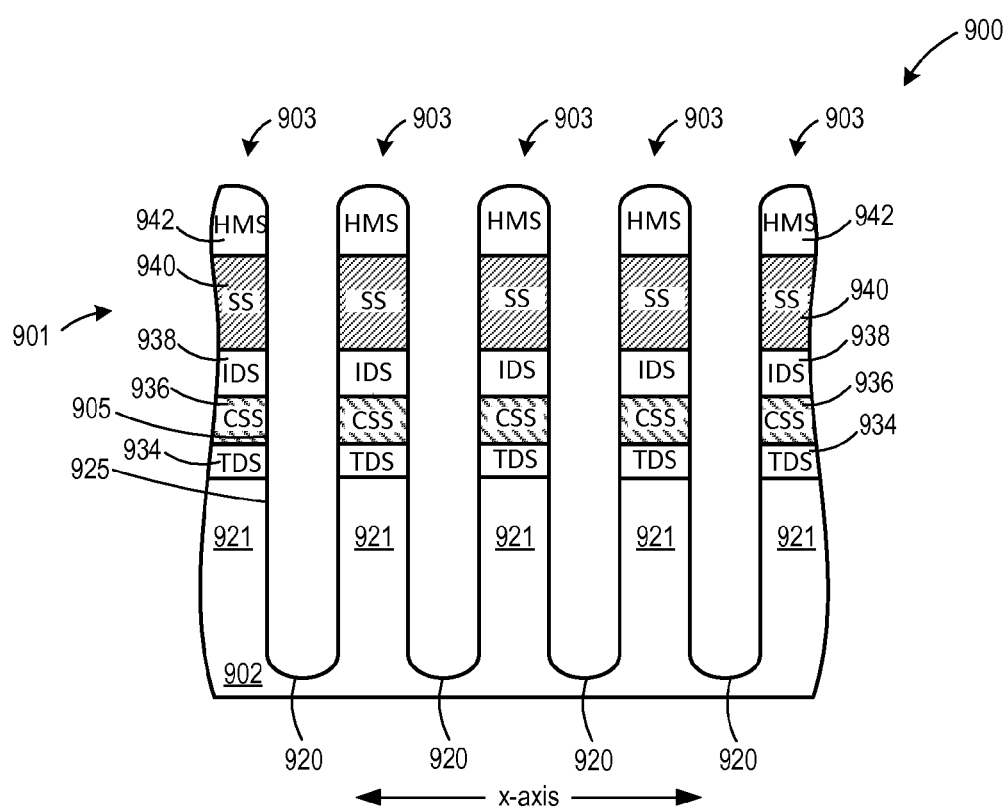

FIG. 9B depicts the memory array after etching in one example. Etching forms layer stack columns 903 that are elongated in the direction of the y-axis with spaces therebetween in the direction of the x-axis. Each layer stack column 903 includes a tunnel dielectric strip (TDS) 934, a charge storage strip (CSS) 936, an intermediate dielectric strip (IDS) 938, a sacrificial strip (SS) 940 and a hard masking strip (HMS) 942. Etching continues into substrate 902 to form isolation trenches 920 which are separated by active areas 921. In one example, the depth of the isolation regions in the substrate is 200 nm. Various depths can be used, for example, ranging from 180-220 nm in one embodiment. In one embodiment, reactive ion etching is used with various combinational etch chemistries to etch the different layers. Any suitable etch process(es) can be used.

Figure 9C:
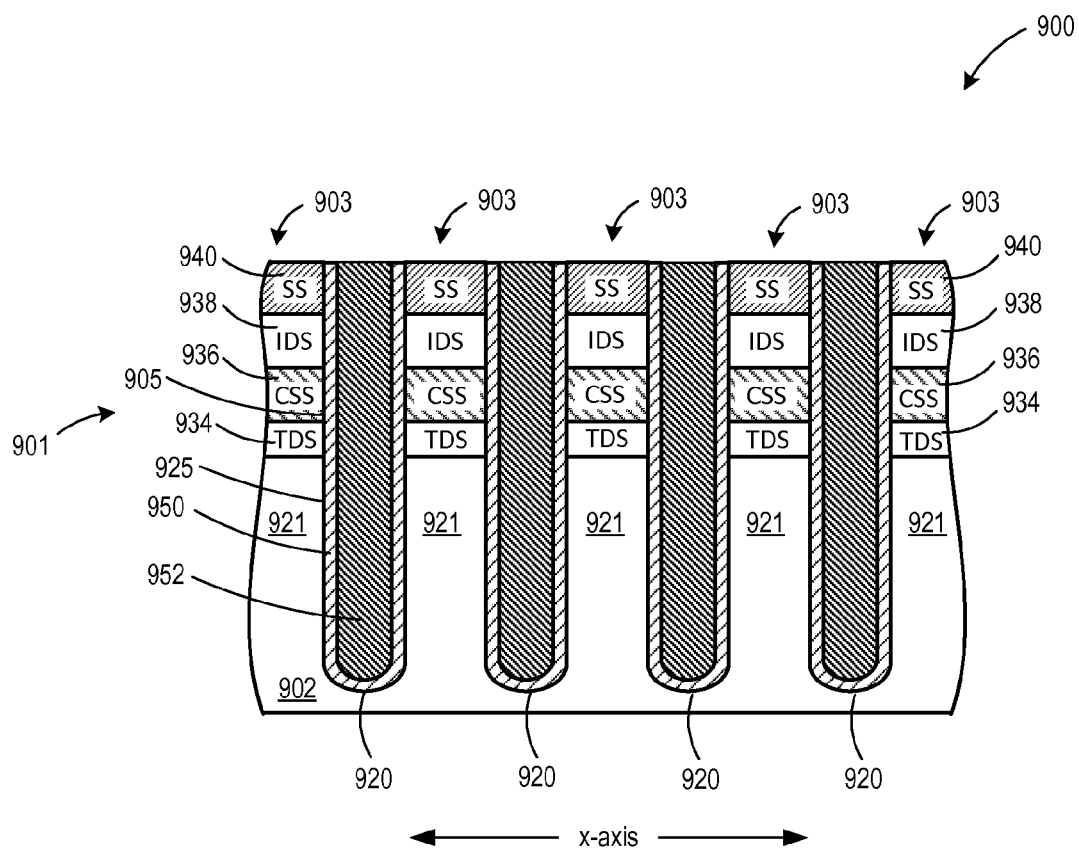

At step 808, the trenches 920 are filled with a dielectric. FIG. 9C shows the device after filling the trenches for one embodiment. A dielectric material 952 fills the trenches in the substrate 902, as depicted in the embodiment of FIG. 9C. In one embodiment, material 952 is a spin on dielectric (SOD) having a high etch selectivity with respect to the liner 950. An oxide is used for material 952 in one example although other materials can be used. One possible alternative is to have an air gap instead of dielectric material 952.

A dielectric liner 950 is formed along the exposed surfaces of the isolation regions in the substrate 902 and along the exposed surfaces of the layer stack columns. The liner coats the vertical sidewalls of the layer stack columns as well as the walls of the isolation regions wall. In one embodiment, the liner 950 is a high-temperature oxide (HTO) formed using a deposition process.

In step 810, material for bottom portions 338 of word lines 200 is deposited. In one embodiment, this material is a barrier metal. The role of this barrier metal layer, in some embodiments, is to block electrons from tunneling through the IPD layer (if, for example, the IPD layer is a thin oxide), thereby preventing the control gate and floating gate from shorting together. In one embodiment, the barrier metal is a high work function metal.

Figure 9D:
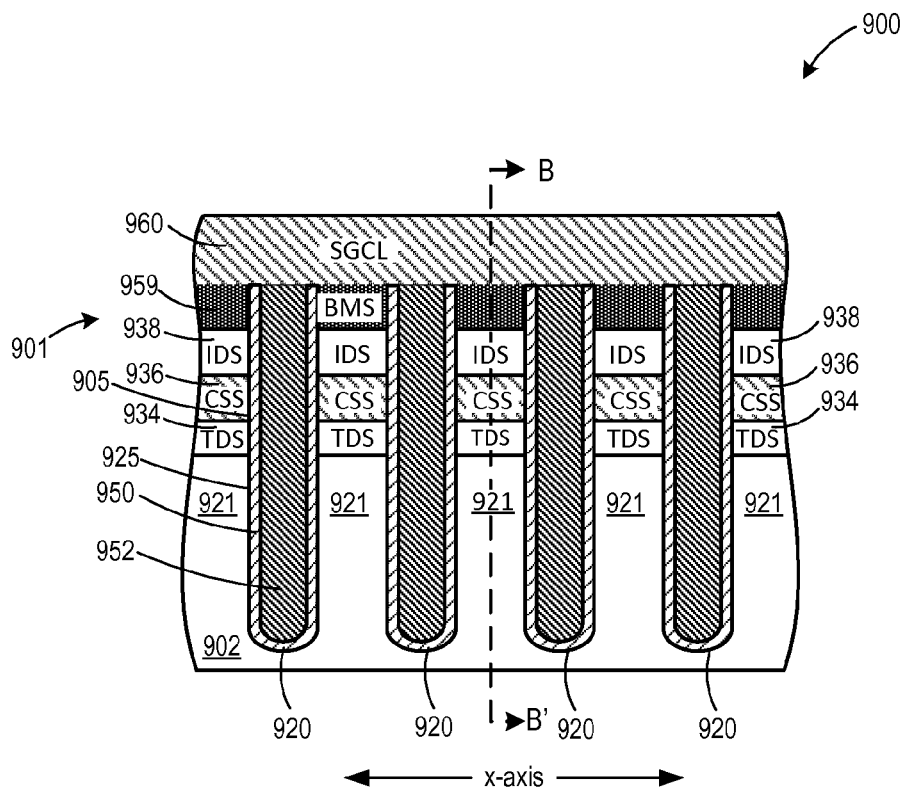

In step 812, sacrificial material is deposited. This sacrificial material will be used in the formation of the top portions 336 of the word lines 200. FIG. 9D depicts results after step 812. The material 959 for bottom portions 338 of word lines 200 is shown disposed on the IDS 938. This is referred to as a barrier metal strip (BMS) 959. Also, a sacrificial control gate layer (SGCL) 960, which was formed in step 812, is shown disposed on material 959. The SGCL 960 may be planarized after deposition.

Figure 9E:
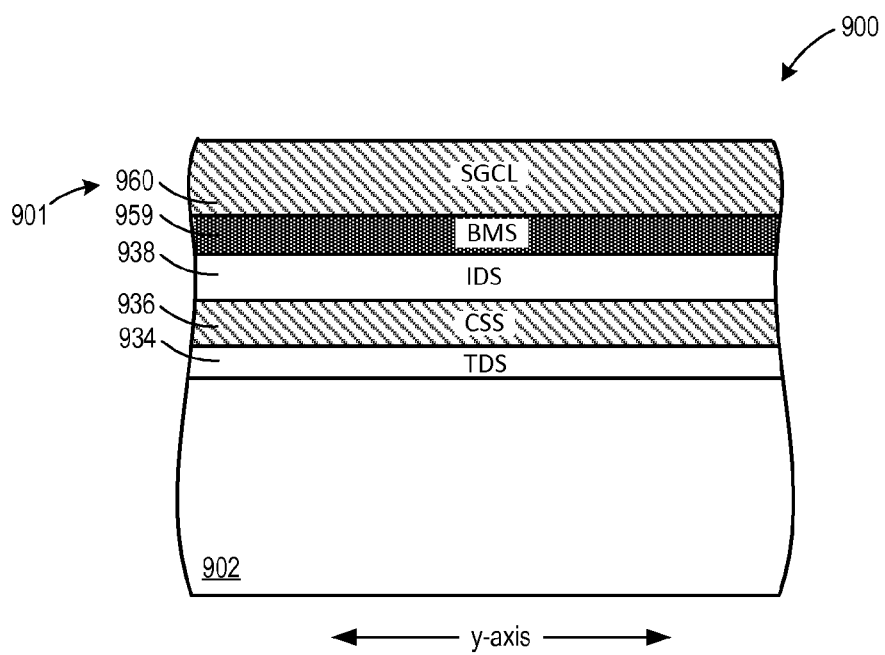

FIG. 9E depicts results after step 812 of a cross section along line B-B' of FIG. 9D. Thus, the cross section is along one of the slots. FIG. 9E shows a view of the structure 901 along the y-axis (or word line).

In step 814, the stack is etched into rows. In one embodiment, etching the layer stack includes etching strips 934 of the tunnel dielectric material. In another embodiment, the tunnel dielectric is not etched. Reactive ion or another suitable etch process may be used. One or more etch chemistries may be applied to etch through the various layers of the stack.

This step includes forming a second pattern over the layer stack. The second pattern is formed for etching orthogonal to the direction of etching using the first pattern. The second pattern may include strips of hard masking material and/or photoresist, or other suitable mask, that are elongated in the row direction along the x-axis with a spacing between strips in the column direction along the y-axis. The pattern defines the gate length for the charge storage region of each memory cell, in one embodiment.

Figure 9F:
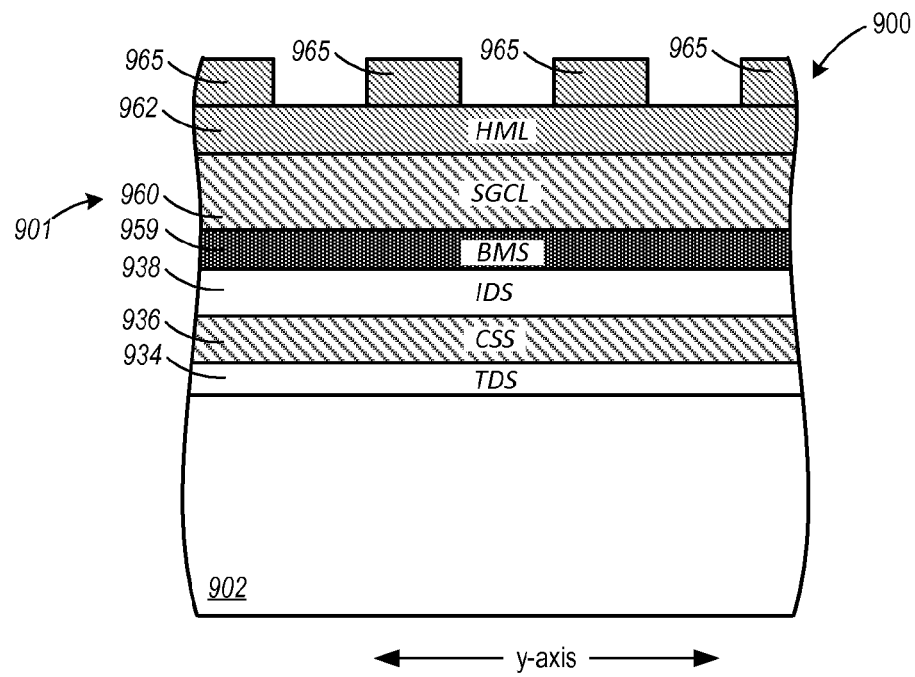

FIG. 9F depicts the results of step 814 after forming the second pattern. Over the sacrificial control gate layer (SCGL)

960 is formed one or more hard masking layers 962. Strips 965 of photoresist or another patterning agent are applied.

Figure 9G:
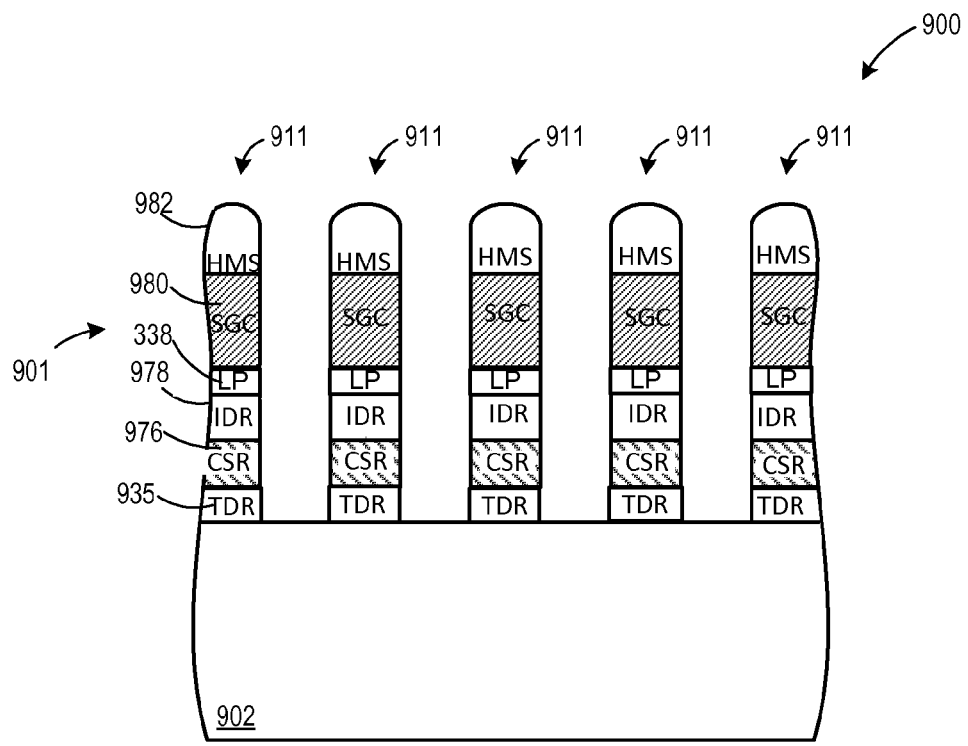

FIG. 9G depicts the results of step 814 after etching. Etching continues until reaching the substrate surface, in this example. In other examples, etching may continue until reaching the tunnel dielectric strips 934. In another example, some portion of the tunnel dielectric 934 is etched without completely etching through. Etching forms layer stack rows 911. The hard masking material is etched into hard mask strips (HMS) 982 and the sacrificial control gate layer 960 is etched into sacrificial control gates (SGC) 980. The barrier metal strips (BMS) 959 are etched into bottom portions (LP) 338 of word lines 200. The intermediate dielectric strips 938 are etched into intermediate dielectric regions (IDR) 978. The charge storage strips 936 are etched into individual charge storage regions (CSR) or floating gates 976. The tunnel dielectric strips 934 are etched into individual charge tunnel dielectric regions (TDR) 935. After etching the layer stack into rows, an implant process can be performed to create n+ source/drain regions. In one embodiment, the n+ source/drain regions are created by implanting n-type dopants such as arsenic or phosphorus into the p-well.

In step 816, the area between two layer stack columns 911 may be filled with spacer insulation material. In step 818, the spacer insulation material and sacrificial control gates may then be planarized in order to create a uniform height of the layer stack columns and sacrificial control gates. This may reduce variation in the memory cells that will be formed.

Figure 9H:
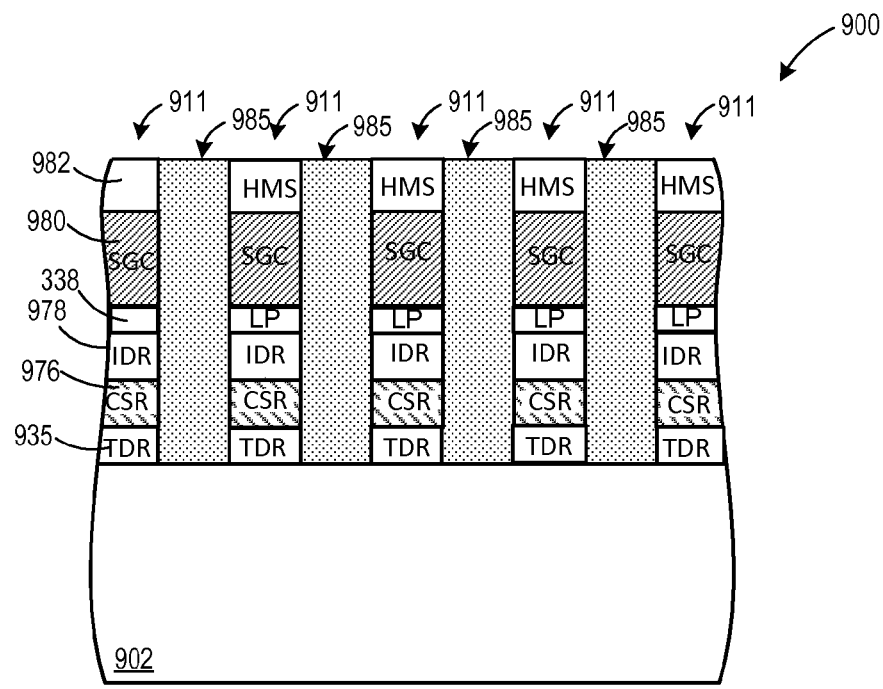

FIG. 9H depicts results after step 816. This spacer insulation material 985 fills the spaces that were formed between the stacks 911. This spacer insulation material 985 may comprise various porous oxides or carbon filler. Other materials may also be used, and the role of the space insulation material will be explained later.

Figure 9I:
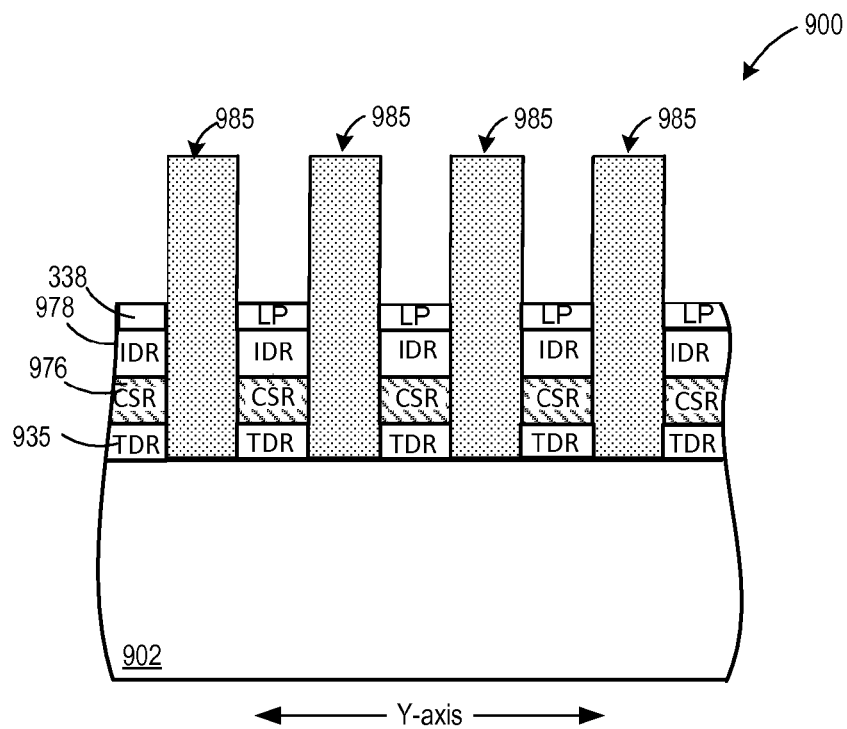

In step 820, the sacrificial control gates may then be removed by etching using a process appropriate to the size, shape, and material of the sacrificial control gates. FIG. 9I depicts results after step 820. In some embodiments, this etching process leaves the bottom portions 338 (e.g., barrier metal) exposed. The height of the spacer insulation material 985 may loom above the exposed polysilicon or barrier metal layer.

Next, a liner material may be formed in step 822. The liner material can be an oxide or other insulator in a thin strip that is disposed on the exposed polysilicon or barrier metal layer, and runs vertically along the sidewall of the spacer insulation material. In step 824, the liner is etched to form spacers.

Figure 9J:
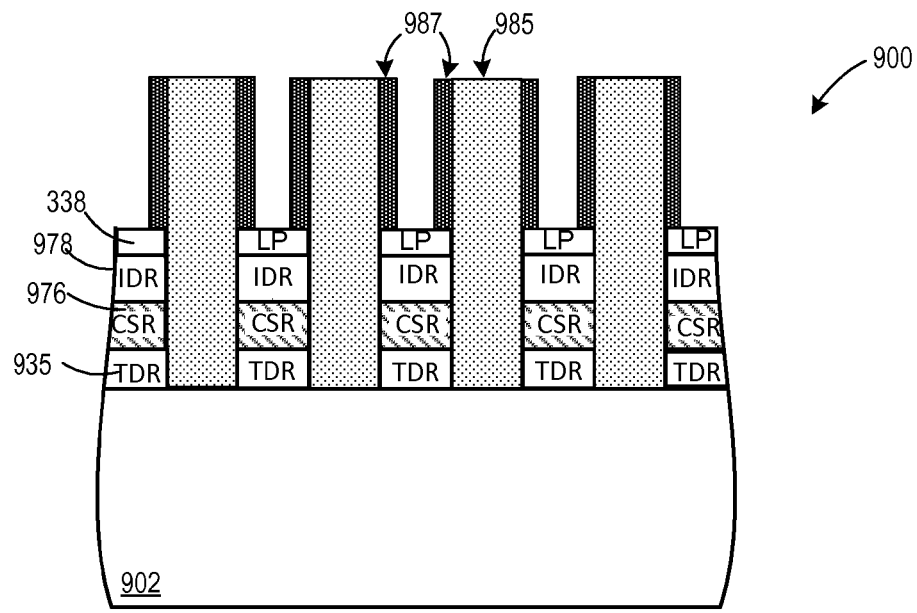

FIG. 9J depicts results after step 824. The spacers 987 are depicted on exposed sidewalls of the spacer insulation material 985.

Figure 9K:
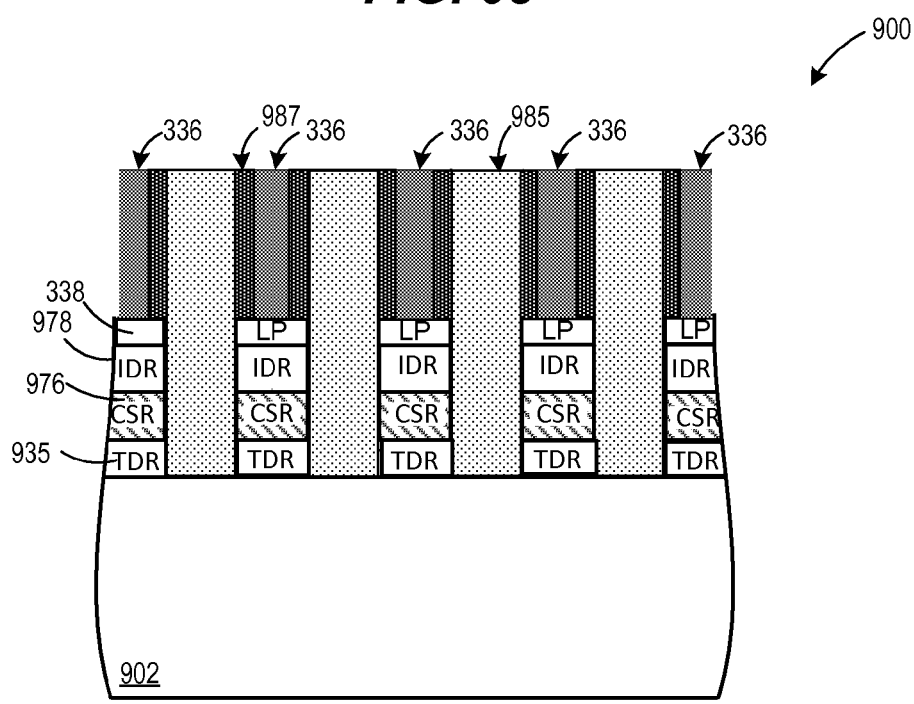

At step 826, material for the top portions 336 of word lines 200 is deposited. A CMP step may also be performed. FIG. 9K depicts results after step 826. The top portions 336 of the word lines are shown as filling the spaces between the spacers 987. The material for the top portions 336 may be tungsten or some other conductor.

The top portions 336 of the word lines are disposed on the bottom portions 338 (e.g., barrier metal). Barrier metal serves as the bottom portions 338 of the word lines 200 in one embodiment. Note that instead of a barrier metal, polysilicon might be used.

These top portions 336 of the word lines, together with the spacers 987, cover the upper surface of the bottom portions 338 of the word lines (e.g., barrier metal). As such, the thicker the spacers 987 in the y-direction, the thinner the top portions 336 of the word lines 200 in the same direction. In this way, the spacers 987 allows for the formation of the word lines with the inverted-T geometry, wherein the 'l' part of the inverted-T is formed by the material deposited in step 826 and wherein the '_' part of the inverted-T is formed by the polysilicon or barrier metal on which the material deposited in step 826 is disposed.

At this point of one embodiment, a functional memory array has been constructed, wherein the spacers 987 and spacer insulation material 985 together form a dielectric that electrically isolate adjacent word lines 200 from each other. However, in some embodiments it is preferred that air gaps separate adjacent word lines 200. In these embodiments, steps 828-832 are optionally added.

Figure 9L:
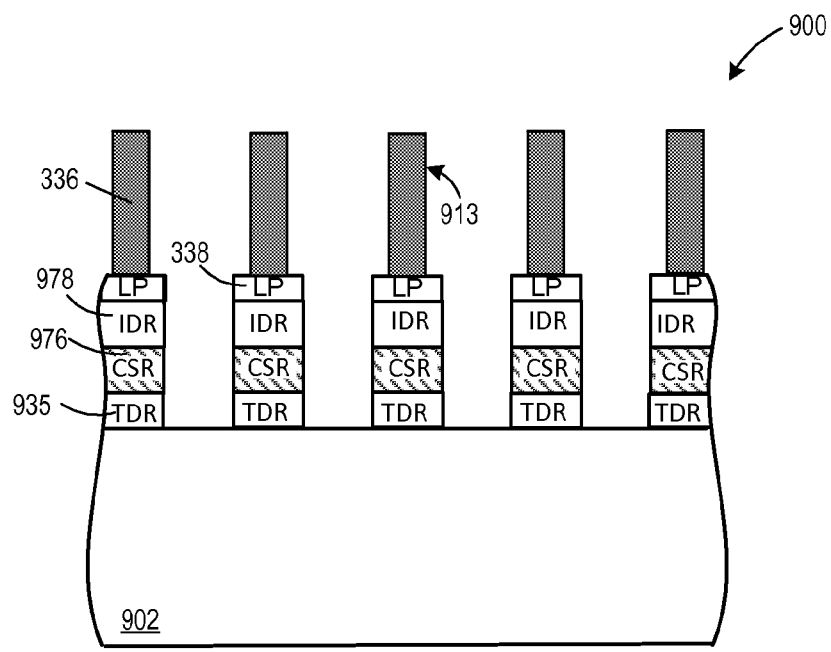

In step 828, the spacers 987 and spacer insulation material 985 are etched away. In some embodiments, a relatively anisotropic etch process is preferred to prevent etching of the IPD or gate insulation materials in the layer stack columns. FIG. 9L depicts results after step 828, showing exposed sidewalls 913 on the top portions 336 of the word lines.

In step 829, bit line air gaps are formed. In one embodiment, a wet etch is performed. In another embodiment, a selected dry etch is performed. Step 829 selectively removes portions of dielectric material 952 (see FIG. 9D). Recall that dielectric material 952 extends in the y-direction.

Figure 9M:
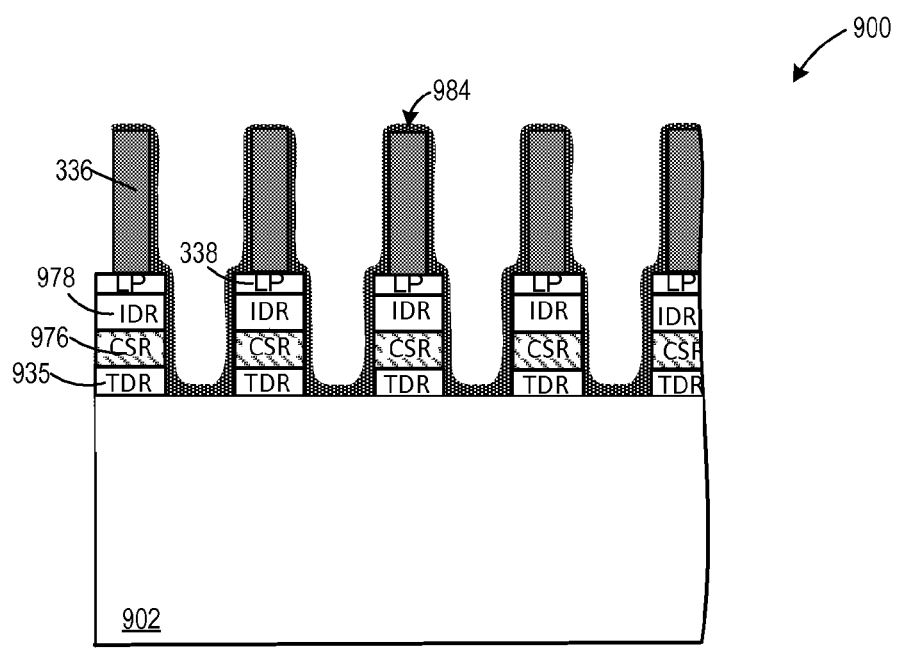
Figure 9N:
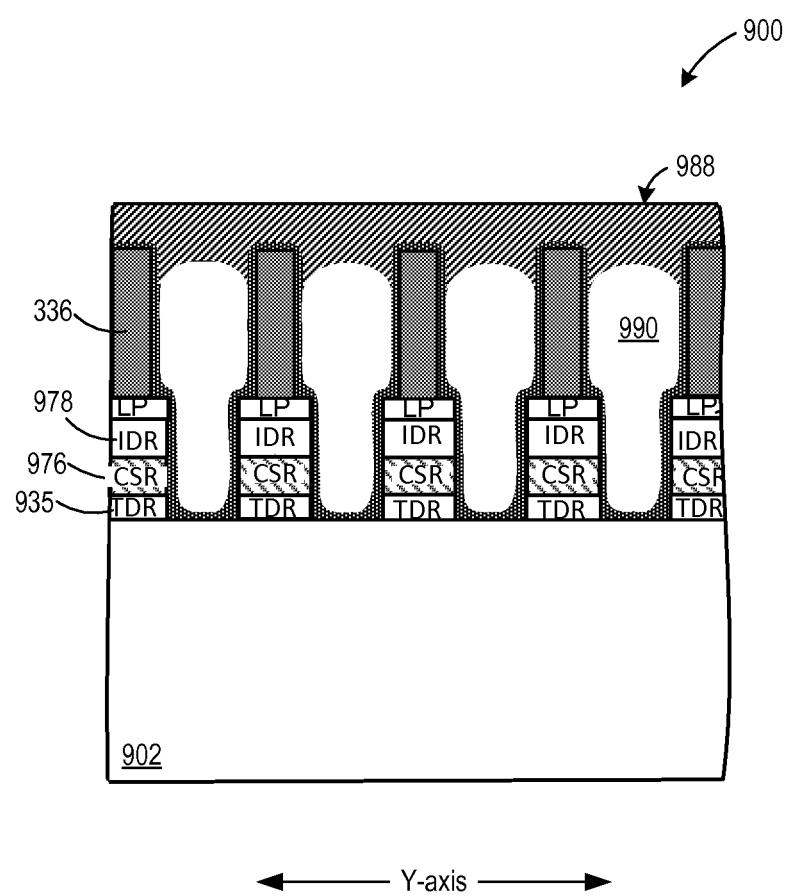

In optional step 830, a dielectric liner (e.g., oxide) is formed along the sidewalls 913 of the top portions 336 of the word lines, as well as sidewalls of the layer stack rows. FIG. 9M depicts results after forming the dielectric liner 984 on the top portions 336 of the word lines. The dielectric liner 984 is also formed over the exposed upper surface of the tunnel dielectric regions 935. The dielectric liner 984 will also be formed along the sidewalls (not shown) of the rows (extending in the y-direction) that are exposed along the bit line air gaps 958.

In step 832, a capping layer is deposited over the control gates of the layer stack columns without filling the space between the layer stack columns. Gases such as air and process gases instead fill the space between the layer stack columns, resulting in the desired air gaps.

FIG. 9N depicts results after step 832. FIG. 9N shows the capping layer 988 and word line air gaps 990. The word line air gaps 990 extend in the x-direction. Thus, the word line air gaps 990 separate the word lines 200. In this example, the word line air gaps 990 separate both the top portions 336 and the bottom portions 338 of the word lines. In this example, the word line air gaps 990 also separate the charge storage region 976 (e.g., floating gates) of memory cells on different NAND strings.

The process of FIG. 8 has shown how word lines may be formed having inverted T-shapes over floating gates. As noted previously, the word line need not have the inverted T-shape all along its extent in the x-direction. The process of FIG. 8 forms word lines 200 in which the inverted T-shape is over the floating gates but not between the floating gates, as depicted in FIGS. 3A, 3B and 4B, in one embodiment. However, with suitable modifications, word lines that maintain inverted T-shape between floating gates, such as depicted in FIGS. 2B, 2D, 4A1, 4A2 may be formed. In some embodiments, word line air gaps 990 and/or bit line air gaps 306 are formed, as depicted in FIGS. 4A1 and 4A2. Furthermore, word lines with control gate extensions 342 such as depicted in FIGS. 5A and 5B may be formed with suitable modifications to FIG. 8.

Figure 10:
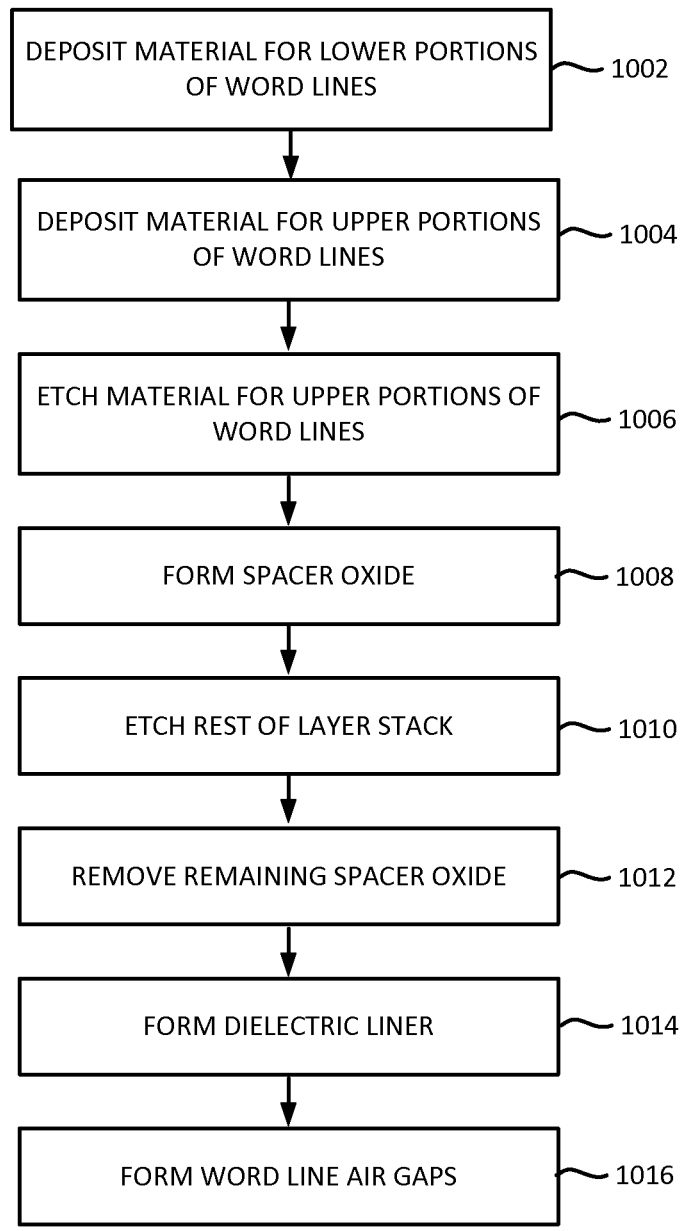
FIG. 10 is a flowchart of one embodiment of a process for fabricating a non-volatile storage device having word lines that have an inverted T-shape over floating gates.

FIG. 10 is a flowchart of one embodiment of a process for fabricating a non-volatile storage device having word lines that have an inverted T-shape over floating gates. FIGS. 11A-11G are cross-sectional views of one example of a non-volatile memory array that can be fabricated according to the method in FIG. 10. FIG. 10 is one embodiment of the process of FIG. 7.

Prior to step 1002, other formation steps can be performed. In one embodiment, process 800 of FIG. 8 is performed up until filling the trenches with dielectric in step 808. Then, step 1002 is performed. In step 1002, material for the bottom portion 338 of the word lines 200 is deposited. Note that this may be the actual material to be used for the bottom portion 338. In step 1004, material for the top portion 336 of the word lines 200 is deposited. Note that this also may be the actual material to be used for the top portion 336. Typically in the process of FIG. 10 two different materials are used for the bottom portion 338 and the top portion 336. In one embodiment, these two materials have a different etch selectivity with respect to each other. In one embodiment, the material for the bottom portion 338 is polysilicon and the material for the top portion 336 is tungsten. However, other materials may be used.

Figure 11A:
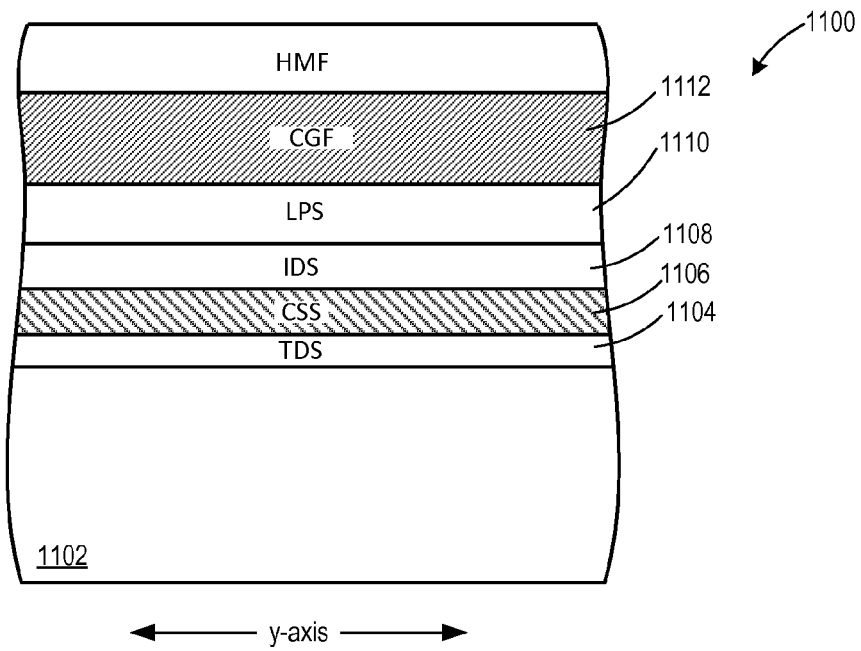
FIGS. 11A-11G are cross-sectional views of one example of a non-volatile memory array that can be fabricated according to the method in FIG. 10.

FIG. 11A depicts results after step 1004. FIG. 11A shows a structure 1100 of a view along the y-axis. That is, this is a view along the word line or row direction. The structure 1100 includes tunnel dielectric strips (TDS) 1104, charge storage strips (CSS) 1106, intermediate dielectric strips (IDS) 1108, material for bottom portion of word lines (LPS) 1110, material for top portions of word lines (CGF) 1112 and one or more hard masking layer(s) (HMF) 1112. It is noted that a layer (or region or strips) may be said to be over another layer when one or more layers are between the two layers as well as when the two layers are in direct contact. These layers (or strips) are over substrate 1102. Note that prior processing (e.g., etching, filling a trench, etc.) has been used such that regions 1104, 1106, 1108, and 1110 may be strips that run in the y-direction at this point. The material for top portions of word lines (CGF) 1112 is not yet strips, in this embodiment.

In step 1006, the material 1110 for the top portion of the word lines is etched. In one embodiment, the material for the top portion etches at a faster rate than the material for the bottom portion. In one embodiment, the material for the top portion has a different etch selectivity with respect to the material for the bottom portion, such that the material for the bottom portions is not etched in step 1006. For example, one material could be a metal, and the other polysilicon.

Figure 11B:
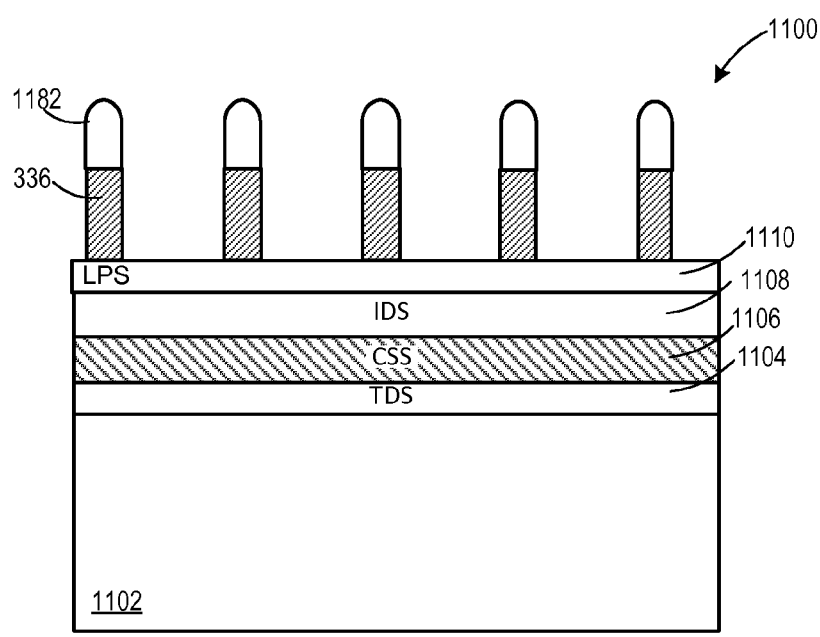

FIG. 11B depicts results after step 1006. The material 1112 for the top portion has been narrowed based on the mask 1182. The top portions 336 have been etched into lines that extend in the x-direction. At this point, formation of the top portions 336 of the word lines may be complete. That is, the top portions 336 may be at about their desired width at this point. However, in other embodiments, some additional slimming may occur during later processing steps. The material for bottom portion of word lines (LPS) 1110 is not yet etched at this point. Note that the top portions 336 are not required to have their sides be perfectly vertical, as represented in FIG. 11B. As one possibility, the sidewalls of the top portions 336 might have some curvature as depicted in FIG. 6B.

Figure 11C:
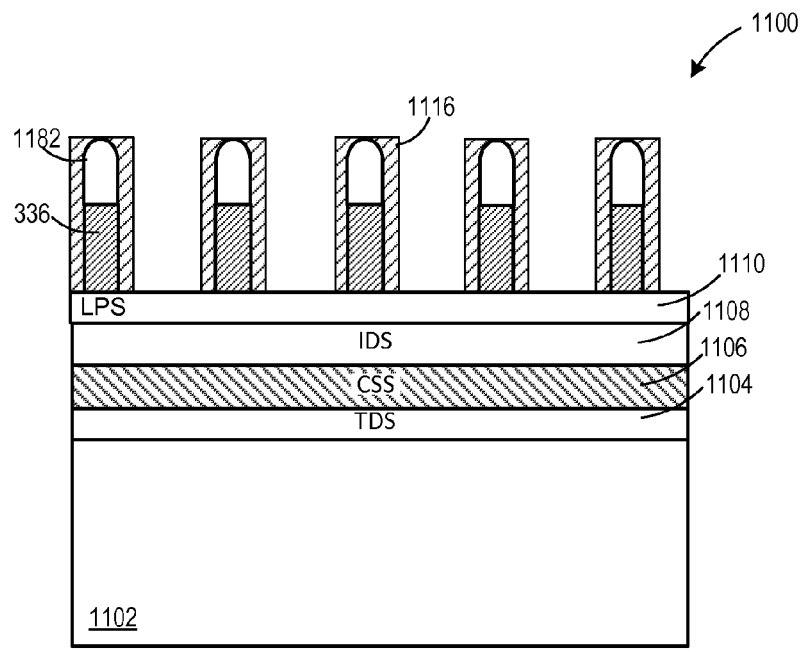

In step 1008, a spacer material is formed. This may be a spacer oxide. FIG. 11C depicts results after step 1006, showing a spacer 1116 formed on the sidewalls of the top portions 336 of word lines, as well as the mask 1182. This spacer will be used to etch that rest of the stack, including the material for the bottom portions of the word lines and the floating gates. Thus, the size of the spacer 1116 may be formed accordingly.

Figure 11D:
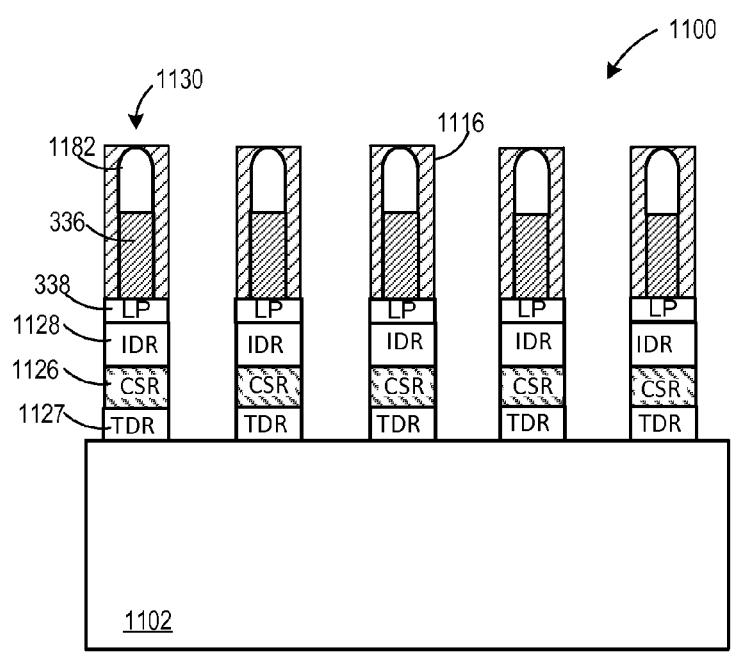

In step 1010, the rest of the stack is etched based on the spacer 1116. FIG. 11D depicts results after step 1010. Etching continues until reaching the substrate 1102 in this example. In other examples, etching may continue until reaching the tunnel dielectric. In another example, some portion of the tunnel dielectric strips 1104 are etched without completely etching through the tunnel dielectric. Etching forms layer stack rows 1130. The LPS 1110 is etched into bottom portions (LP) 338 of word lines 200. The intermediate dielectric strips 1108 are etched into intermediate dielectric regions (IDR) 1128. The charge storage strips 1106 are etched into individual charge storage regions (CSR) or floating gates 1126. The tunnel dielectric strips 1104 are etched into individual tunnel dielectric regions (TDR) 1127. After etching the layer stack into rows, an implant process can be performed to create n+ source/drain regions. In one embodiment, the n+ source/drain regions are created by implanting n-type dopants such as arsenic or phosphorus into the p-well.

Figure 11E:
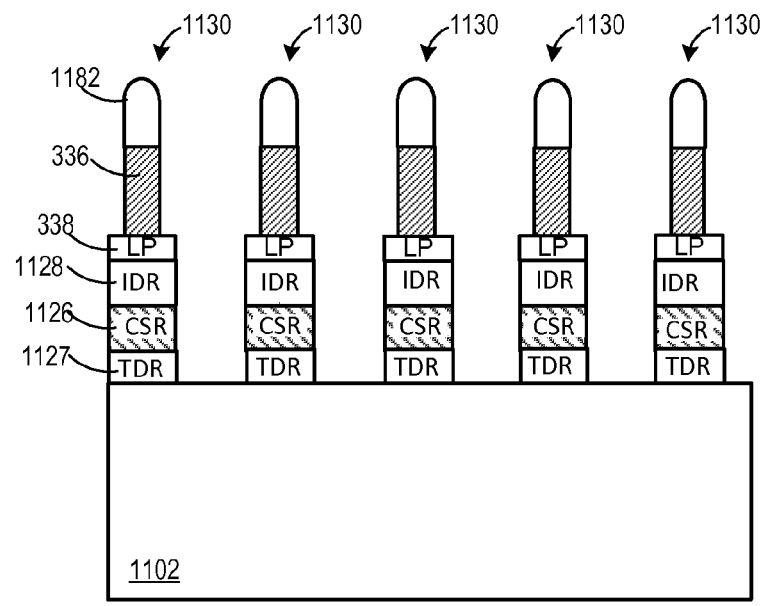

In step 1012, the remaining spacer material is removed. FIG. 11E depicts results after step 1012, showing the stacks 1130 without the spacer material.

Figure 11F:
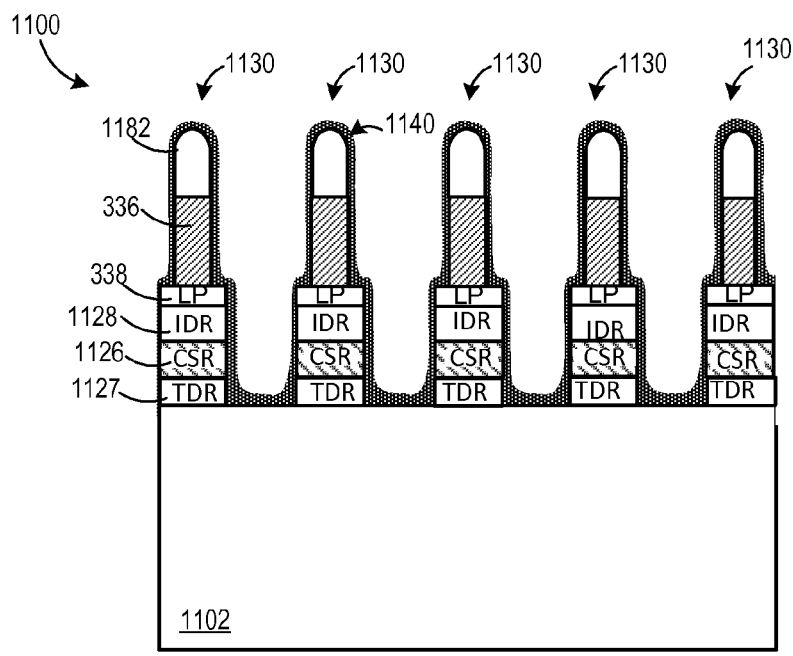

In step 1014, a dielectric layer is added. FIG. 11F depicts results after step 1014. The dielectric liner 1140 (e.g., oxide) is formed along the sidewalls of the layer stack rows 1130. The dielectric liner 1140 is also formed over the exposed upper surface of the tunnel dielectric strips 1104. The dielectric liner 1140 will also be formed along the sidewalls (not shown) of the rows (extending in the y-direction) that are exposed along the bit line air gaps.

Figure 11G:
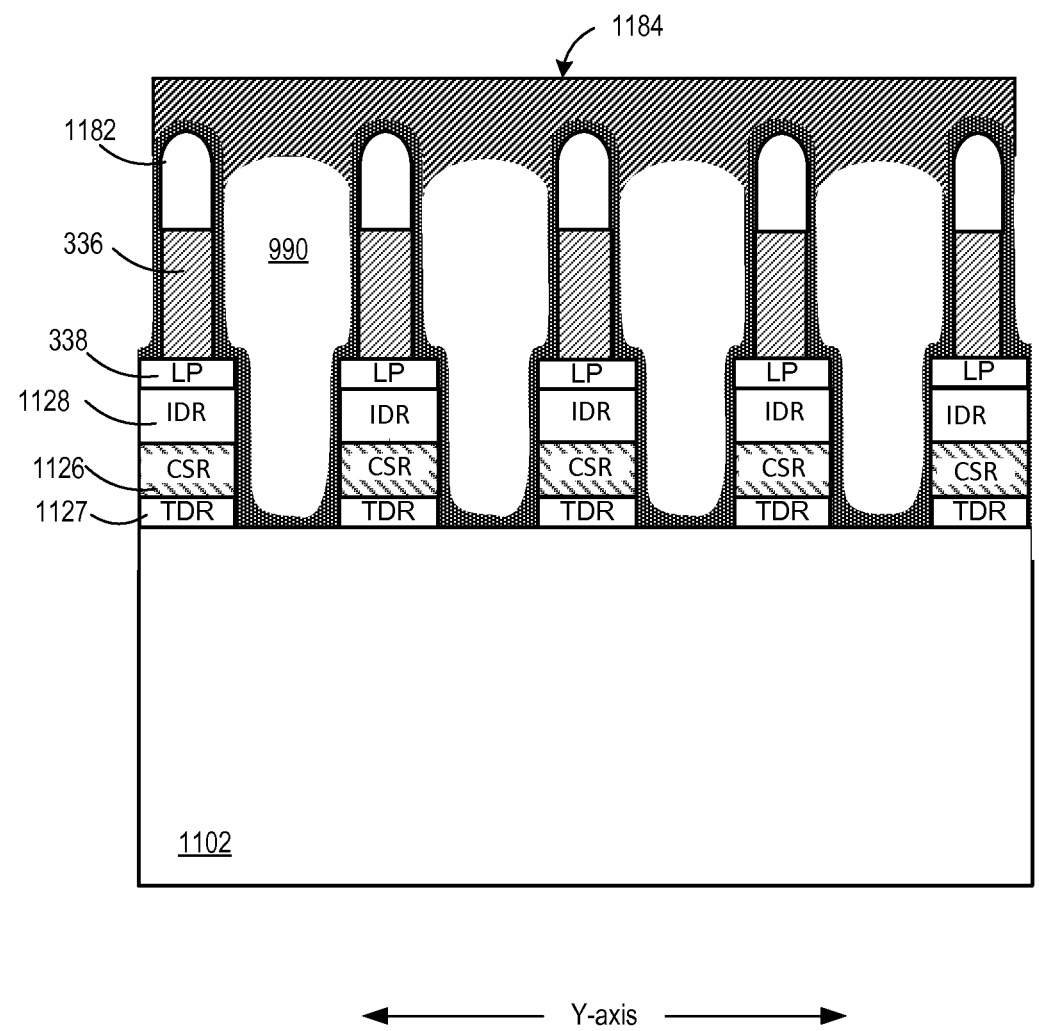

In step 1016, word line air gaps are formed. FIG. 11G depicts results after step 1016. In step 1016, a capping layer 1184 is deposited over the hard masks 1182 of the layer stack columns without filling the space between the layer stack columns. Gases such as air and process gases instead fill the space between the layer stack columns, resulting in the desired air gaps.

The word line air gaps 990 extend in the x-direction. Thus, the word line air gaps 990 separate the word lines 200. In this example, the word line air gaps 990 separate both the top portions 336 and the bottom portions 338 of the word lines. In this example, the word line air gaps 990 also separate the charge storage region 1126 (e.g., floating gates) of memory cells on different NAND strings.

Note that bit line air gaps may also be formed in the process of FIG. 10. Formation may be similar to that described in the process of FIG. 8.

The process of FIG. 10 has shown how word lines may be formed having inverted T-shapes over floating gates. As noted previously, the word line need not have the inverted T-shape all along its extent in the x-direction. The process of FIG. 10 forms word lines 200 in which the top portion has some curvature, as depicted in FIG. 6B, in one embodiment. The process of FIG. 10 forms word lines 200 in which the inverted T-shape is over the floating gates but not between the floating gates, as depicted in FIGS. 3A, 3B and 4B, in one embodiment. However, with suitable modifications, word lines that maintain inverted T-shape between floating gates, such as depicted in FIGS. 2B, 2D, 4A1, 4A2 may be formed. Note that a structure having word line air gaps 990 and/or bit line air gaps 306, such as depicted in FIGS. 4A1 and 4A2 may be formed. Furthermore, word lines with control gate extensions 342 such as depicted in FIGS. 5A and 5B may be formed with suitable modifications to FIG. 10.

FIG. 12 depicts an exemplary structure of a memory cell array 1252 that can be fabricated using one or more embodiments of the disclosed technology. As one example, a NAND flash EEPROM is described that is partitioned into 1,024 blocks. The data stored in each block can be simultaneously erased. In one embodiment, the block is the minimum unit of cells that are simultaneously erased. In each block, in this example, there are 8,512 columns that are divided into even columns and odd columns. The bit lines are also divided into even bit lines (BLE) and odd bit lines (BLO). FIG. 12 shows four memory cells connected in series to form a NAND string. Although four cells are shown to be included in each NAND string, more or less than four can be used (e.g., 16, 32, or another number). One terminal of the NAND string is connected to a corresponding bit line via a first select transistor (also referred to as a select gate) SGD, and another terminal is connected to c-source via a second select transistor SGS.

During read and programming operations for memory cells of one embodiment, 4,256 memory cells are simultaneously selected. The memory cells selected have the same word line (e.g. WL2-i), and the same kind of bit line (e.g. even bit lines). Therefore, 532 bytes of data can be read or programmed simultaneously. These 532 bytes of data that are simultaneously read or programmed form a logical page. Therefore, in this example, one block can store at least eight pages. When each memory cell stores two bits of data (e.g. a multi-level cell), one block stores 16 pages. In another embodiment, a memory array is formed that utilizes an all bit-line architecture such that each bit line within a block is simultaneously selected, including those adjacent in the x-direction.

In other embodiments, the bit lines are not divided into odd and even bit lines. Such architectures are commonly referred to as all bit line architectures. In an all bit line architecture, all the bit lines of a block are simultaneously selected during read and program operations. Memory cells along a common word line and connected to any bit line are programmed at the same time. In other embodiments, the bit lines or block can be broken up into other groupings (e.g., left and right, more than two groupings, etc.).

Figure 13:
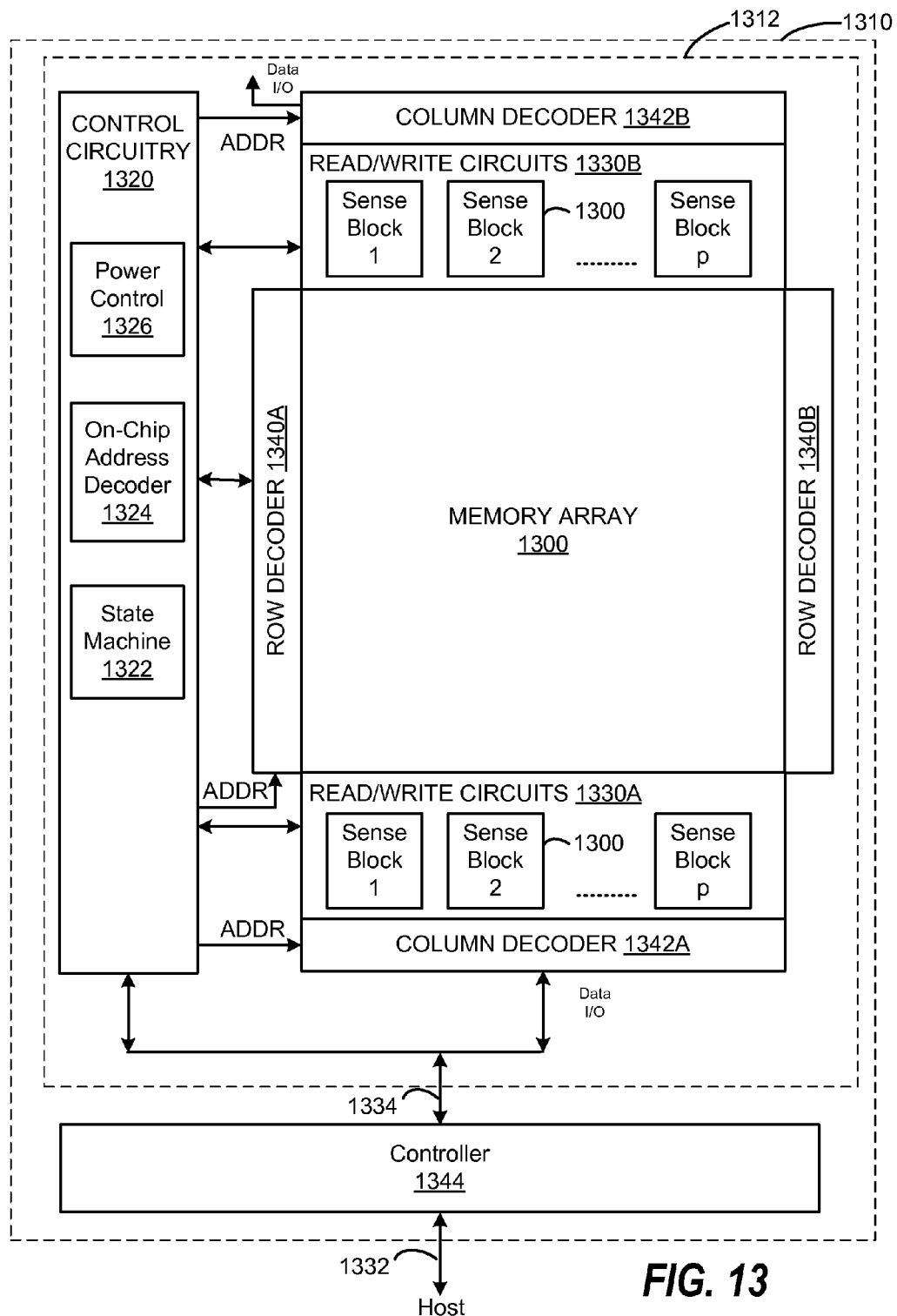
FIG. 13 is a block diagram depicting an example of a memory system that can be fabricated or used to implement embodiments of the disclosed technology.

FIG. 13 illustrates a non-volatile storage device 1310 that may include one or more memory die or chips 1312. Memory die 1312 includes an array (two-dimensional or three dimensional) of memory cells 1300, control circuitry 1320, and read/write circuits 1330A and 1330B. In one embodiment, access to the memory array 1300 by the various peripheral circuits is implemented in a symmetric fashion, on opposite sides of the array, so that the densities of access lines and circuitry on each side are reduced by half. The read/write circuits 1330A and 1330B include multiple sense blocks 1300 which allow a page of memory cells to be read or programmed in parallel. The memory array 1300 is addressable by word lines via row decoders 1340A and 1340B and by bit lines via column decoders 1342A and 1342B. In a typical embodiment, a controller 1344 is included in the same memory device 1310 (e.g., a removable storage card or package) as the one or more memory die 1312. Commands and data are transferred between the host and controller 1344 via lines 1332 and between the controller and the one or more memory die 1312 via lines 1334. One implementation can include multiple chips 1312.

Control circuitry 1320 cooperates with the read/write circuits 1330A and 1330B to perform memory operations on the memory array 1300. The control circuitry 1320 includes a state machine 1322, an on-chip address decoder 1324 and a power control module 1326. The state machine 1322 provides chip-level control of memory operations. The on-chip address decoder 1324 provides an address interface to convert between the address that is used by the host or a memory controller to the hardware address used by the decoders 1340A, 1340B, 1342A, and 1342B. The power control module 1326 controls the power and voltages supplied to the word lines and bit lines during memory operations. In one embodiment, power control module 1326 includes one or more charge pumps that can create voltages larger than the supply voltage.

In one embodiment, one or any combination of control circuitry 1320, power control circuit 1326, decoder circuit 1324, state machine circuit 1322, decoder circuit 1342A, decoder circuit 1342B, decoder circuit 1340A, decoder circuit 1340B, read/write circuits 1330A, read/write circuits 1330B, and/or controller 1344 can be referred to as one or more managing circuits.

Figure 14:
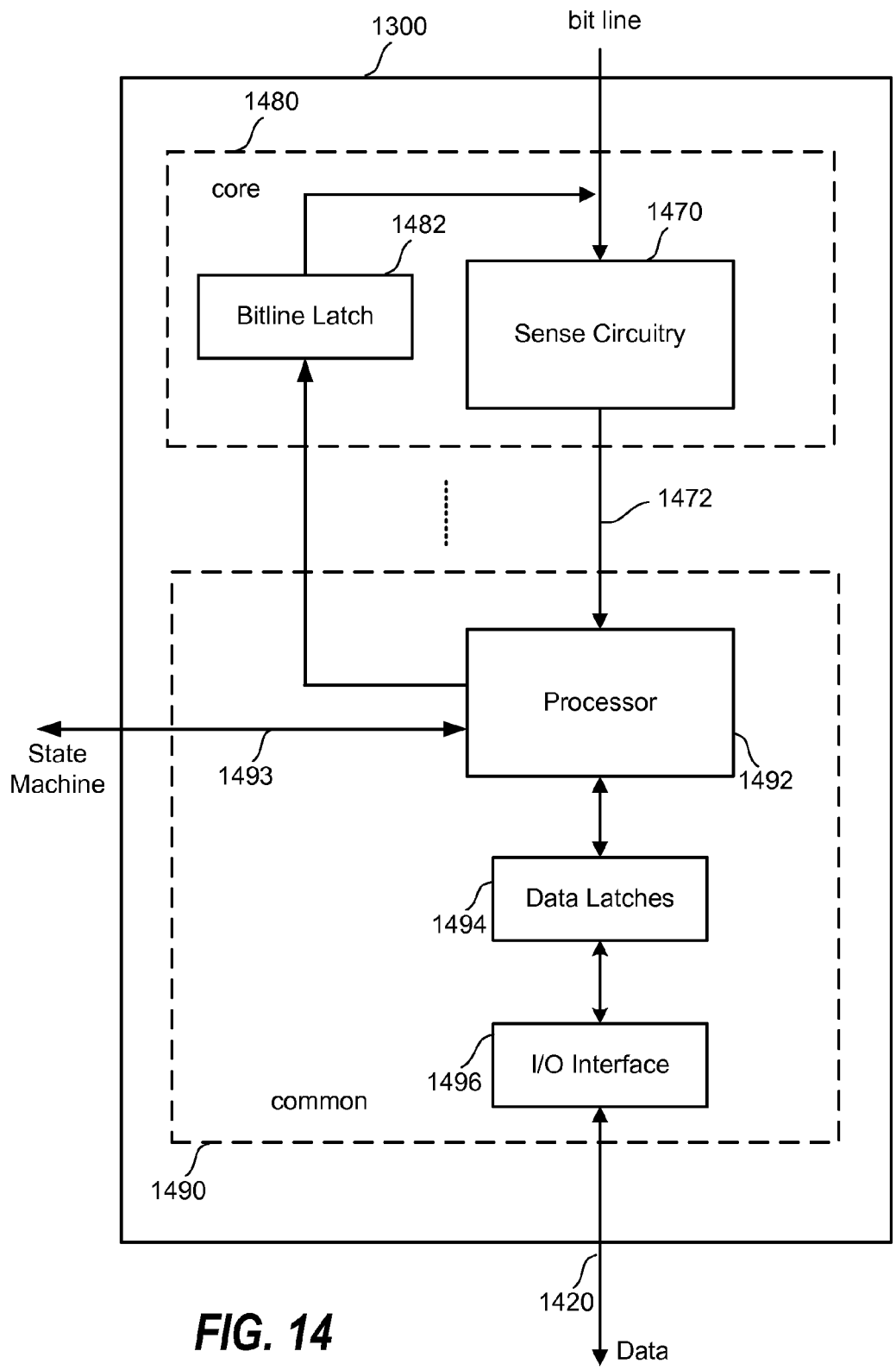
FIG. 14 is a block diagram depicting one embodiment of a sense block.

FIG. 14 is a block diagram of an individual sense block 1300 partitioned into a core portion, referred to as a sense module 1480, and a common portion 1490. In one embodiment, there will be a separate sense module 1480 for each bit line and one common portion 1490 for a set of multiple sense modules 1480. In one example, a sense block will include one common portion 1490 and eight sense modules 1480. Each of the sense modules in a group will communicate with the associated common portion via a data bus 1472.

Sense module 1480 comprises sense circuitry 1470 that determines whether a conduction current in a connected bit line is above or below a predetermined threshold level. In some embodiments, sense module 1480 includes a circuit commonly referred to as a sense amplifier. Sense module 1480 also includes a bit line latch 1482 that is used to set a voltage condition on the connected bit line. For example, a predetermined state latched in bit line latch 1482 will result in the connected bit line being pulled to a state designating program inhibit (e.g., Vdd).

Common portion 1490 comprises a processor 1492, a set of data latches 1494 and an I/O Interface 1496 coupled between the set of data latches 1494 and data bus 1420. Processor 1492 performs computations. For example, one of its functions is to determine the data stored in the sensed memory cell and store the determined data in the set of data latches. The set of data latches 1494 is used to store data bits determined by processor 1492 during a read operation. It is also used to store data bits imported from the data bus 1420 during a program operation. The imported data bits represent write data meant to be programmed into the memory. I/O interface 1496 provides an interface between data latches 1494 and the data bus 1420.

During read or sensing, the operation of the system is under the control of state machine 1022 that controls the supply of different control gate voltages to the addressed cell. As it steps through the various predefined control gate voltages corresponding to the various memory states supported by the memory, the sense module 1480 may trip at one of these voltages and an output will be provided from sense module 1480 to processor 1492 via bus 1472. At that point, processor 1492 determines the resultant memory state by consideration of the tripping event(s) of the sense module and the information about the applied control gate voltage from the state machine via input lines 1493. It then computes a binary encoding for the memory state and stores the resultant data bits into data latches 1494. In another embodiment of the core portion, bit line latch 1482 serves double duty, both as a latch for latching the output of the sense module 1480 and also as a bit line latch as described above.

It is anticipated that some implementations will include multiple processors 1492. In one embodiment, each processor 1492 will include an output line (not depicted in FIG. 14) such that each of the output lines is wired-OR'd together. In some embodiments, the output lines are inverted prior to being connected to the wired-OR line. This configuration enables a quick determination during the program verification process of when the programming process has completed because the state machine receiving the wired-OR line can determine when all bits being programmed have reached the desired level. For example, when each bit has reached its desired level, a logic zero for that bit will be sent to the wired-OR line (or a data one is inverted). When all bits output a data 0 (or a data one inverted), then the state machine knows to terminate the programming process. In embodiments where each processor communicates with eight sense modules, the state machine may (in some embodiments) need to read the wired-OR line eight times, or logic is added to processor 1492 to accumulate the results of the associated bit lines such that the state machine need only read the wired-OR line one time.

During program or verify, the data to be programmed is stored in the set of data latches 1494 from the data bus 1420. The program operation, under the control of the state machine, comprises a series of programming voltage pulses (with increasing magnitudes) applied to the control gates of the addressed memory cells. Each programming pulse is followed by a verify process to determine if the memory cell has been programmed to the desired state. Processor 1492 monitors the verified memory state relative to the desired memory state. When the two are in agreement, processor 1492 sets the bit line latch 1482 so as to cause the bit line to be pulled to a state designating program inhibit. This inhibits the cell coupled to the bit line from further programming even if it is subjected to programming pulses on its control gate. In other embodiments the processor initially loads the bit line latch 1482 and the sense circuitry sets it to an inhibit value during the verify process.

Data latch stack 1494 contains a stack of data latches corresponding to the sense module. In one embodiment, there are 3-5 (or another number) data latches per sense module 1480. In one embodiment, the latches are each one bit. In some implementations (but not required), the data latches are implemented as a shift register so that the parallel data stored therein is converted to serial data for data bus 1420, and vice versa. In one preferred embodiment, all the data latches corresponding to the read/write block of m memory cells can be linked together to form a block shift register so that a block of data can be input or output by serial transfer. In particular, the bank of read/write modules is adapted so that each of its set of data latches will shift data in to or out of the data bus in sequence as if they are part of a shift register for the entire read/write block.

Additional information about the read operations and sense amplifiers can be found in (1) U.S. Pat. No. 7,196,931, "Non-Volatile Memory And Method With Reduced Source Line Bias Errors,"; (2) U.S. Pat. No. 7,023,736, "Non-Volatile Memory And Method with Improved Sensing,"; (3) U.S. Patent Application Pub. No. 2005/0169082; (4) U.S. Pat. No. 7,196,928, "Compensating for Coupling During Read Operations of Non-Volatile Memory," and (5) United States Patent Application Pub. No. 2006/0158947, "Reference Sense Amplifier For Non-Volatile Memory," published on Jul. 20, 2006. All five of the immediately above-listed patent documents are incorporated herein by reference in their entirety.

Various features and techniques have been presented with respect to the NAND flash memory architecture. It will be appreciated from the provided disclosure that implementations of the disclosed technology are not so limited. By way of non-limiting example, embodiments in accordance with the present disclosure can provide and be used in the fabrication of a wide range of semiconductor devices, including but not limited to logic arrays, volatile memory arrays including SRAM and DRAM, and non-volatile memory arrays including both the NOR and NAND architecture.

In one embodiment, a non-volatile storage device, comprises a plurality of strings of non-volatile storage elements having floating gates and dielectric disposed on the floating gates. The strings extend in a column direction. The non-volatile storage device also comprises a plurality of word lines that extend in a row direction and are associated with the plurality of strings of non-volatile storage elements. A cross section of the word lines above the floating gates in the column direction have an inverted T-shape. The dielectric separates the word lines from the floating gates. The word lines may serve as control gates of the non-volatile storage elements.

One embodiment includes a method of fabricating non-volatile storage. Steps comprise forming a plurality of strings of non-volatile storage elements having floating gates and dielectric disposed on the floating gates, and forming a plurality of word lines disposed on dielectric. The strings extend in a column direction. Each of the word lines extends in a row direction and is associated with a group of the non-volatile storage elements on different strings. A cross section of the word lines over the floating gates in the column direction has an inverted T-shape. The word lines may serve as control gates of the non-volatile storage elements.

One embodiment includes a non-volatile memory structure comprising a plurality of NAND strings non-volatile storage elements. Each NAND string extends in a column direction. Each non-volatile storage element comprises a gate insulation region disposed on a semiconductor substrate, a floating gate region disposed on the gate insulation region, a dielectric region disposed on the floating gate region, and a control gate region disposed on the dielectric region. The control gate region has a bottom portion and an top portion. The bottom portion has a middle region extending in the row direction between a first outer region and a second outer region each extending in the row direction. The top portion is disposed on the middle region of the bottom portion. The top portion is thinner than the bottom portion in the column direction. The top portion has a first sidewall and a second sidewall each extending in the row direction. The memory structure further includes a first dielectric region over the first outer region of the bottom portion of the control gate region and located directly adjacent to the first sidewall, as well as a second dielectric region over the second outer region of the bottom portion of the control gate region and located directly adjacent to the second sidewall.

Embodiments described herein can be used with NAND flash memory with air gaps, NAND flash memory without air gaps and other types of non-volatile memory.

The foregoing detailed description has been presented for purposes of illustration and description. It is not intended to be exhaustive or to limit the subject matter claimed herein to the precise form(s) disclosed. Many modifications and variations are possible in light of the above teachings. The described embodiments were chosen in order to best explain the principles of the disclosed technology and its practical application to thereby enable others skilled in the art to best utilize the technology in various embodiments and with various modifications as are suited to the particular use contemplated. It is intended that the scope of the invention be defined by the claims appended hereto.

What is claimed is:

1. A non-volatile storage device, comprising:
   a plurality of strings of non-volatile storage elements having charge storage regions and dielectric that resides on the charge storage regions, the strings extend in a column direction; and
   a plurality of word lines that extend in a row direction and are associated with the plurality of strings of non-volatile storage elements, a cross section of the word lines above the charge storage regions in the column direction is an inverted T-shape, the dielectric separates the word lines from the charge storage regions, wherein the plurality of word lines each comprise a top portion and a bottom portion, wherein the bottom portion is wider than the top portion in the column direction, wherein the bottom portion is adjacent to the charge storage regions, wherein the top portion of each of the word lines extends in the row direction across the plurality of strings.

2. The non-volatile storage device of claim 1, wherein the plurality of word lines are separated by respective word line air gaps in the row direction.

3. The non-volatile storage device of claim 1, wherein:
the top portion of each word line resides on the bottom portion, wherein the top portion is composed of a first material and the bottom portion is composed of a second material different from the first material.

4. The non-volatile storage device of claim 1, wherein:
the charge storage regions each have a pair of sidewalls with faces perpendicular to the row direction; and
the dielectric covers the pair of sidewalls of a given charge storage region, a word line associated with the charge storage regions of a group of the non-volatile storage elements on different strings comprises portions extending downward between adjacent pairs of the charge storage regions and covering the dielectric adjacent to the pair of sidewalls of a given charge storage region.

5. The non-volatile storage device of claim 1, wherein:
the charge storage regions each have a top;
the dielectric covers the tops of the charge storage regions, the bottom portions of the word lines reside on the dielectric over the tops of the charge storage regions, the top portion of a given word line connects bottom portions of the given word line that reside over charge storage regions associated with different strings.

6. The non-volatile storage device of claim 1, wherein the strings are NAND strings in the column direction.

7. A method of fabricating non-volatile storage, comprising:
forming a plurality of strings of non-volatile storage elements having charge storage regions and dielectric disposed on the charge storage regions, the strings extend in a column direction; and
forming a plurality of word lines disposed on dielectric, each of the word lines extending in a row direction and associated with a group of the non-volatile storage elements on different strings, wherein a cross section of the word lines over the charge storage regions in the column direction is an inverted T-shape, wherein the plurality of word lines each comprise a top portion and a bottom portion, wherein the bottom portion is wider than the top portion in the column direction, wherein the bottom portion is adjacent to the charge storage regions, wherein the top portion of each of the word lines extends in the row direction across the plurality of strings.

8. The method of claim 7, further comprising forming a plurality of word line air gaps that separate respective pairs of the plurality of word lines.

9. The method of claim 7, wherein the forming a plurality of word lines comprises:
depositing a first material for the bottom portions of the word lines; and
depositing a second material different from the first material for the top portions of the word lines;
selectively etching the second material to form the top portions of the word lines.

10. The method of claim 9, wherein the selectively etching the second material to form the top portions of the word lines comprises performing a reactive ion etch.

11. The method of claim 9, wherein the selectively etching the second material leaves the top portions with sidewalls that extend in the row direction, further comprising:
forming spacers on the sidewalls of the top portions of the word lines; and
etching the second material based on the spacers to form the bottom portions of the word lines.

12. The method of claim 7, wherein the forming a plurality of word lines comprises:
depositing material for the bottom portions of the word lines;
depositing sacrificial control gate material over the material for the bottom portions of the word lines;
etching the sacrificial control gate material and the material for the bottom portions of the word lines in the row direction;
filling, with an oxide, spaces that result from etching the sacrificial control gate material and the material for bottom portions of the word lines;
removing remaining sacrificial control gate material, leaving exposed sidewalls on the oxide;
forming spacers on the sidewalls of the oxide; and
forming the top portions of the word lines between the spacers.

13. The method of claim 12, wherein the forming the top portions of the word lines between the spacers comprises depositing a material that is different from the material for the bottom portions of the word lines.

14. The method of claim 7, wherein the forming a plurality of strings of non-volatile storage elements comprises forming a plurality of NAND strings in the column direction.

15. A non-volatile memory structure comprising:
a plurality of NAND strings of non-volatile storage elements, each NAND string extending in a column direction, each non-volatile storage element comprising:
a gate insulation region that resides on a semiconductor substrate;
a charge storage region that resides on the gate insulation region;
a dielectric region that resides on the charge storage region; and
a control gate region that resides on the dielectric region, the control gate region consists of a bottom portion and a top portion, the bottom portion having a middle region extending in a row direction between a first outer region and a second outer region each extending in the row direction, the top portion resides on the middle region of the bottom portion, the top portion is thinner than the bottom portion in the column direction, the top portion having a first sidewall and a second sidewall each extending in the row direction;
a first dielectric region over the first outer region of the bottom portion and located directly adjacent to the first sidewall; and
a second dielectric region over the second outer region of the bottom portion and located directly adjacent to the second sidewall, wherein the first dielectric region and the second dielectric region are part of a solid material that separates both the top portions and the bottom portions of adjacent control gates on different NAND strings.

16. The non-volatile memory structure of claim 15, wherein the top portion is composed of a first material and the bottom portion is composed of a second material different from the first material.

17. The non-volatile memory structure of claim 15, wherein the solid material comprises first portions that separate the top portions of adjacent control gates on different NAND strings and second portions that separate the bottom portions of adjacent control gates on different NAND strings, wherein the first portions are wider than the second portions.

18. The non-volatile memory structure of claim 15, wherein for each non-volatile storage element:
   the charge storage region has a pair of sidewalls having faces perpendicular to the row direction;
   the dielectric region covers the faces of the pair of sidewalls of the charge storage region; and
   a portion of the control gate covers a surface of the dielectric region adjacent to the faces of the pairs of sidewalls.

19. The non-volatile storage device of claim 1, wherein the charge storage region is a floating gate.

20. The method of fabricating non-volatile storage of claim 7, wherein the charge storage region is a floating gate.

21. The non-volatile memory structure of claim 17, wherein the charge storage region is a floating gate.

22. The non-volatile storage device of claim 1, wherein the bottom portion of the word line is the same width in the column direction as the charge storage region.

23. The non-volatile storage device of claim 1, wherein the charge storage region is a dielectric charge storage material.

24. The method of fabricating non-volatile storage of claim 7, wherein the charge storage region is a dielectric charge storage material.

25. The non-volatile memory structure of claim 17, wherein the charge storage region is a dielectric charge storage material.

* * * * *